United States Patent
Limberg

(10) Patent No.: US 8,418,022 B2
(45) Date of Patent: Apr. 9, 2013

(54) UTILIZATION OF NON-SYSTEMATIC (207, 187) REED-SOLOMON CODING IN MOBILE/HAND-HELD DIGITAL TELEVISION RECEIVERS

(76) Inventor: Allen LeRoy Limberg, Port Charlotte, FL (US)

( * ) Notice: Subject to any disclaimer, the term of this patent is extended or adjusted under 35 U.S.C. 154(b) by 244 days.

(21) Appl. No.: 12/931,688

(22) Filed: Feb. 8, 2011

(65) Prior Publication Data

US 2012/0204080 A1      Aug. 9, 2012

Related U.S. Application Data

(60) Provisional application No. 61/340,957, filed on Mar. 25, 2010.

(51) Int. Cl.
*H03M 13/00*      (2006.01)

(52) U.S. Cl.
USPC ........... 714/755; 714/784; 714/758; 714/780; 714/786

(58) Field of Classification Search .................. 714/755, 714/780, 785
See application file for complete search history.

(56) References Cited

U.S. PATENT DOCUMENTS

| | | | | |
|---|---|---|---|---|
| 7,206,352 | B2 * | 4/2007 | Birru et al. ................. | 375/265 |
| 7,230,654 | B2 * | 6/2007 | Liu et al. .................... | 348/726 |
| 7,469,027 | B2 * | 12/2008 | Liu et al. .................... | 375/355 |
| 7,519,898 | B2 * | 4/2009 | Narayanan et al. ......... | 714/801 |
| 7,529,312 | B2 * | 5/2009 | Chen ........................... | 375/269 |
| 7,617,441 | B2 * | 11/2009 | Lee et al. .................... | 714/800 |
| 7,617,442 | B2 * | 11/2009 | Shen et al. .................. | 714/801 |
| 7,995,667 | B2 * | 8/2011 | Hansen et al. .............. | 375/265 |
| 8,055,979 | B2 * | 11/2011 | Wu et al. .................... | 714/773 |

* cited by examiner

*Primary Examiner* — Esaw Abraham

(57) ABSTRACT

Non-systematic (207, 187) Reed-Solomon codewords contain valuable information concerning the correctness of the outer convolutional coding of the serial concatenated convolutional coding (SCCC) used for transmitting digital television (DTV) data to mobile/handheld (M/H) receivers. M/H receivers are described that, before and during turbo decoding of the SCCC, decode (207, 187) Reed-Solomon (RS) coding of transport-stream packets encapsulating M/H DTV data. The results of the decoding the RS coding locate bytes in the outer convolutional coding of the SCCC very unlikely to be in error. The confidence levels of bits in those bytes are adjusted accordingly, so turbo decoding of the SCCC converges faster. In M/H receivers of preferred design, the results of decoding RS coded transport-stream packets are used to signal when such convergence is reached, to stop the iterative SCCC decoding procedures before a prescribed maximum number of iterations, thus to conserve operating power.

20 Claims, 21 Drawing Sheets

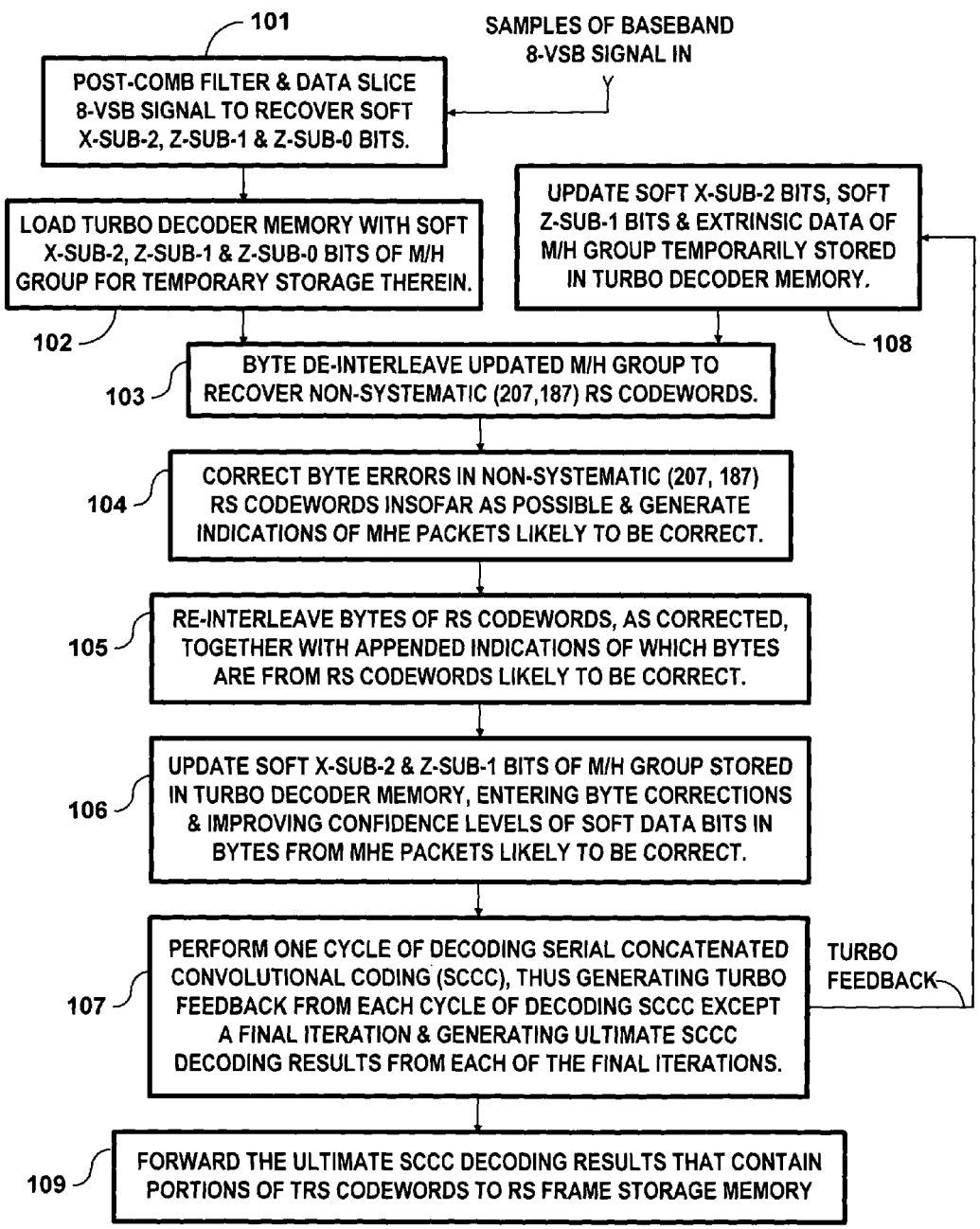
Fig. 6  Method of Turbo Decoding with FIG. 3 M/H Receiver Apparatus

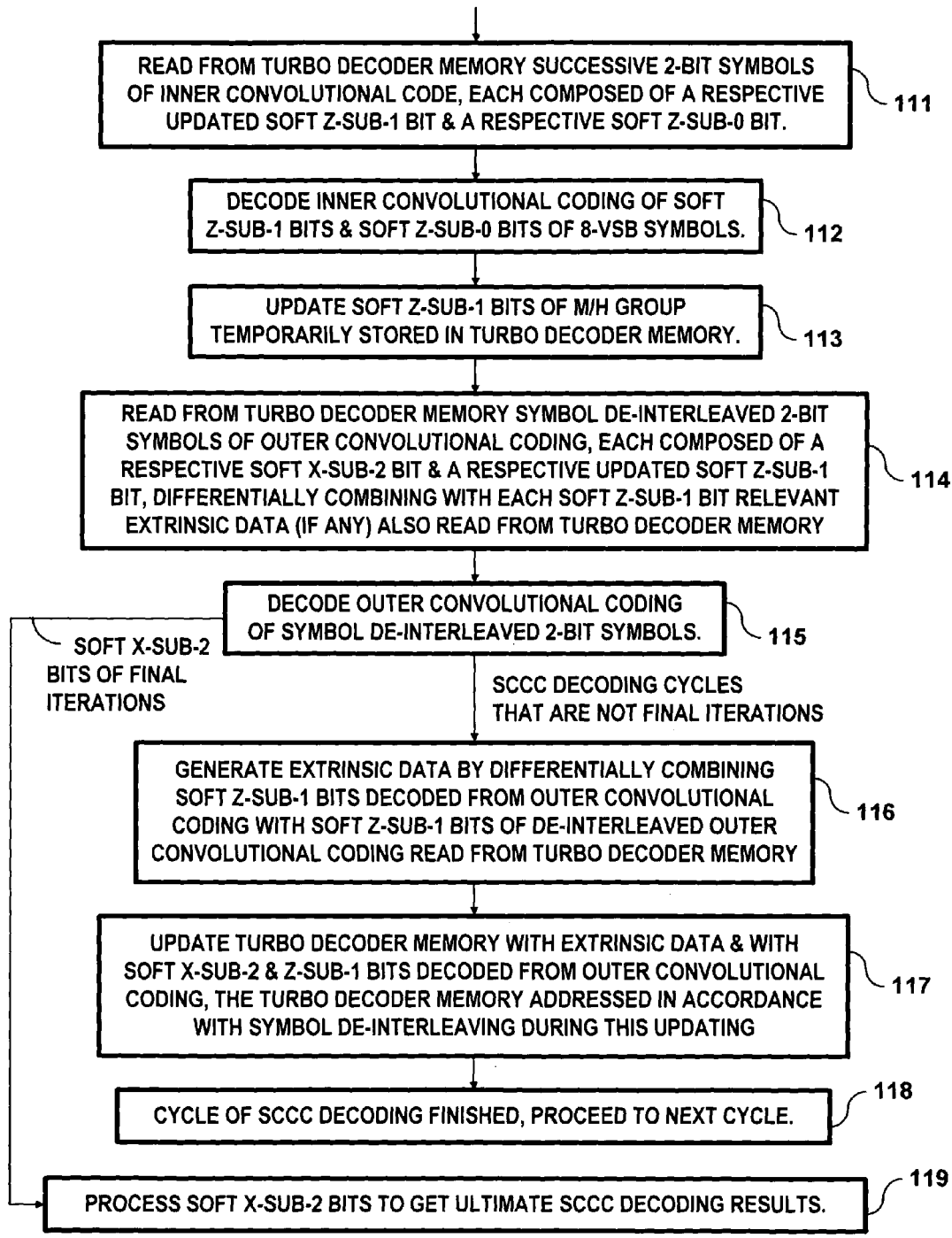
Fig. 7  Cycle of SCCC Decoding in Fig. 6 Turbo Decoding Method

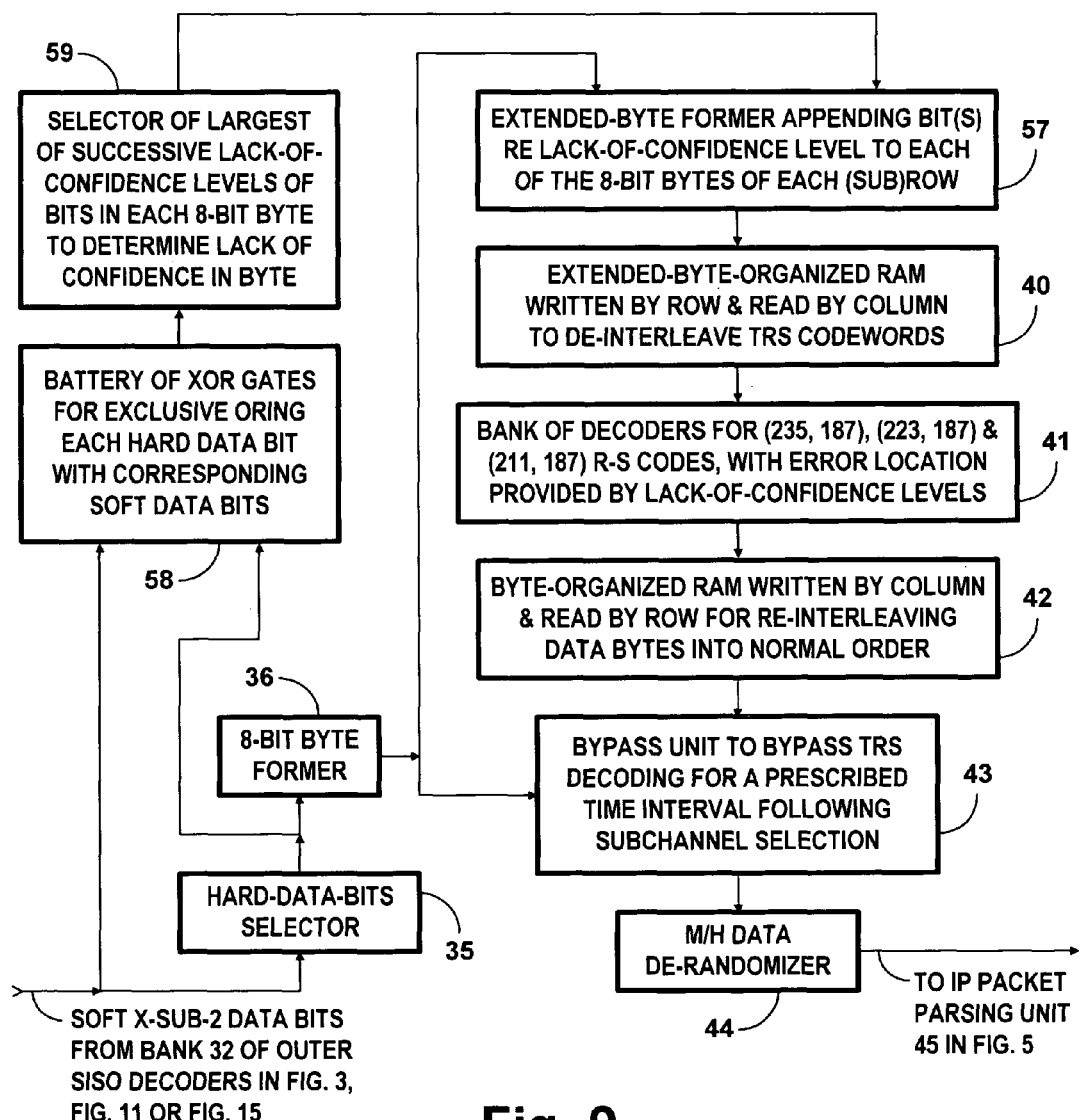

Fig. 14 Modified Cycle of SCCC Decoding in Fig. 6 Turbo Decoding Method

Fig. 18  Modified Cycle of SCCC Decoding in Fig. 6 Turbo Decoding Method

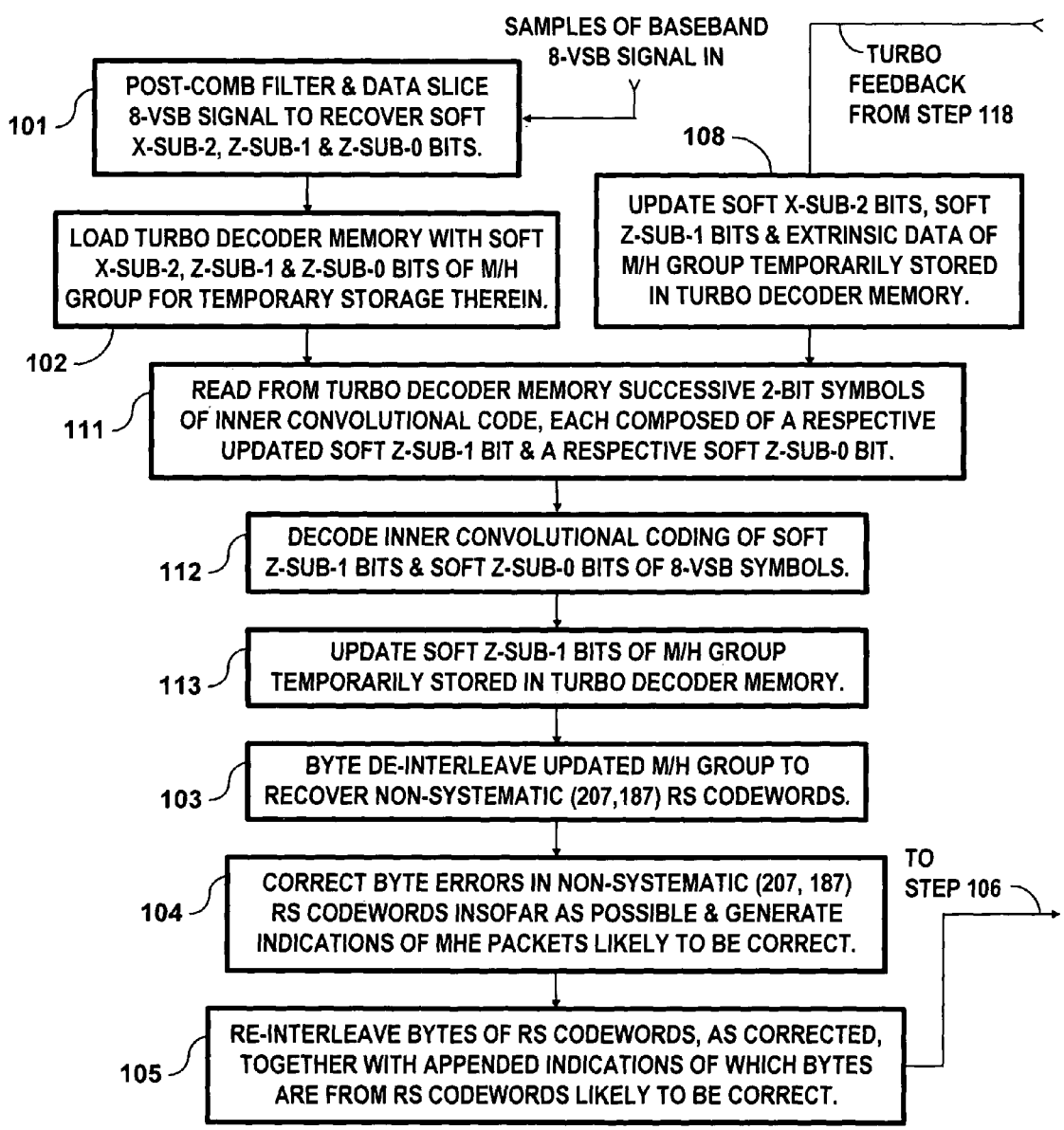

UTILIZATION OF NON-SYSTEMATIC (207, 187) REED-SOLOMON CODING IN MOBILE/HAND-HELD DIGITAL TELEVISION RECEIVERS

This application claims the benefit of the filing date of provisional U.S. Pat. App. Ser. No. 61/340,957 filed on 25 Mar. 2010.

The invention relates to mobile and hand-held receivers for digital television (DTV) signals broadcast over the air broadcasting, commonly referred to collectively as "M/H" receivers.

BACKGROUND OF THE INVENTION

The Advanced Television Systems Committee (ATSC) published a Digital Television Standard in 1995 as Document A/53, hereinafter referred to simply as "A/53" for sake of brevity. Annex D of A/53 titled "RF/Transmission Systems Characteristics" is of particular relevance to this specification, defining many of the terms employed herein. In the beginning years of the twenty-first century, efforts were made to provide for more robust transmission of data over broadcast DTV channels without unduly disrupting the operation of so-called "legacy" DTV receivers already in the field. These efforts culminated in an ATSC standard directed to broadcasting data to mobile receivers being adopted on 15 Oct. 2009. This standard, referred to as "A/153", is also relevant to this specification, defining many of the terms employed herein. The data for concatenated convolutional coding are commonly referred to as "M/H data" in reference to the mobile and handheld receivers that will receive such data.

Both A/53 and A/153 are directed to 8-VSB signals being used in DTV broadcasting. A radio-frequency (RF) 8-VSB signal is transmitted by vestigial-sideband amplitude modulation of a single carrier wave in accordance with an 8-level modulating signal that encodes 3-bit symbols descriptive of 2-bit symbols of the digital data to be transmitted. The three bits in the 3-bit symbols are referred to as Z-sub-2, Z-sub-1 and Z-sub-0 bits. The initial and final bits of each successive 2-bit symbol of the digital information are referred to as an X-sub-2 bit and as an X-sub-1 bit, respectively. The X-sub-2 bits are subjected to interference-filter pre-coding to generate the Z-sub-2 bits, which Z-sub-2 bits can be post-comb filtered in a DTV receiver to recover the X-sub-2 bits. The Z-sub-1 bits correspond to the X-sub-1 bits. The Z-sub-0 bits are redundant bits resulting from one-half-rate convolutional coding of successive X-sub-1 bits to provide two-thirds-rate trellis coding as prescribed by A/53.

A/53 prescribes (207, 187) Reed-Solomon forward-error-correction (RS FEC) coding of data followed by convolutional byte interleaving before two-thirds-rate trellis coding that employs one-half-rate convolutional coding of the less significant bits of successive two-bit symbols of data. It is a common practice in the digital coding arts to precede convolutional coding by RS FEC coding and byte interleaving of the RS FEC codewords. In a receiver the decoding of the convolutional coding is apt to contain burst errors caused by the decoding procedures stretching response to bit errors. De-interleaving the burst errors breaks protracted burst errors up into isolated byte errors that can oftentimes be corrected in reliance upon the RS FEC coding. Usual practice is to complete decoding of the convolutional coding before subsequent de-interleaving, to break up burst errors into isolated byte errors, and decoding of the RS FEC coding, to correct the isolated byte errors if there are not too many per RS FEC codeword.

A/153 prescribes serial concatenated convolutional coding (SCCC) of data transmitted to mobile receivers, which SCCC uses one-half-rate outer convolutional coding upon such data followed by symbol-interleaving and two-thirds-rate trellis coding similar to that prescribed by A/53. The one-half-rate convolutional coding incorporated within the two-thirds-rate trellis coding serves as one-half-rate inner convolutional coding in the SCCC. A/153 further prescribes additional forward-error-correction coding of the data transmitted to mobile receivers, which additional FEC coding comprises transverse Reed-Solomon (TRS) coding combined with lateral cyclic-redundancy-check (CRC) codes to locate byte errors for the TRS coding. The TRS FEC coding helps overcome temporary fading in which received signal strength momentarily falls below that needed for successful reception. The strongest TRS codes prescribed by A/153 can overcome such drop-outs in received signal strength that are as long as four tenths of a second.

Since the adoption of A/153, some members of ATSC have expressed concern with the capability of transmissions made in accordance with A/153 having sufficient capability to overcome burst noise that is of shorter duration, but occurs frequently within an RS Frame. These ATSC members have suggested further error-correction coding of M/H data, designed to be decoded in the internet-protocol (IP) transport-stream (TS) packets recovered from the RS Frames in the so-called "physical layer" portion of an M/H receiver. The inventor points out that, because burst noise tends to align with the rows, row-wise FEC coding of M/H data from RS Frames is at a disadvantage compared to FEC coding that is transverse to those rows. This problem is mitigated a bit by the symbol interleaving associated with SCCC. But not a great amount, since SCCC is designed primarily for overcoming additive white Gaussian noise (AWGN) or the like and is not very effective at overcoming burst noise of considerable duration.

The principal design task for the transverse Reed-Solomon (TRS) coding used in the RS Frames prescribed by A/153 is overcoming drop-outs in received strength caused by reception nulls when the receiver is moved through an electromagnetic field subject to multipath signal propagation. However, the shortened 255-byte Reed-Solomon (RS) codes used for TRS coding are very powerful codes for correcting shorter burst errors, especially when used together with codes for locating byte-errors. If RS codes are relieved of having to locate byte-errors as well as correct them, they can correct as many byte-errors within each of them as each has parity bytes. If RS codes have to locate byte-errors as well as correct them, they can correct only one-half as many byte-errors within each of them as each has parity bytes. Providing a sufficient number of parity bytes in each RS code to implement the principal design task for TRS coding requires a significant investment in reduced M/H payload. The inventor's opinion is that care should be taken to maximize the return from that investment.

A/153 prescribes two-dimensional coding of RS Frames of randomized M/H data in which the bytes in each RS frame are cyclically redundantly coded row by row to form respective cyclical redundant code (CRC) codewords. These row-long CRC codewords can be used as error-locating codes for the TRS codewords, but only in common, on a collectively shared basis. This works reasonably well when overcoming protracted drop-outs in received strength caused by reception nulls when the receiver is moved through an electromagnetic field subject to multipath signal propagation. These protracted errors typically extend several rows of bytes in the RS Frame and affect all TRS codewords in the RS Frame.

Each occurrence of shorter burst noise is apt to affect only some of the TRS codewords in the RS Frame. Intermittent electrical arcing in the motors of household appliances or unshielded electrical ignition wiring of gasoline engines can cause such shorter burst noise. Several occurrences of such shorter burst noise are apt to occur in some RS Frames. The row-long CRC codewords will respond to each occurrence of shorter burst noise to locate a byte error in each and all of the TRS codewords in the RS Frame. Several occurrences of shorter burst noise in an RS Frame can cause the row-long CRC codewords to locate more possible byte-error locations than can be accommodated by a TRS decoder using a byte-error-correction-only decoding algorithm for correcting TRS codewords. The TRS decoder can be designed so as then to switch over to a byte-error-location-and-correction decoding algorithm for correcting TRS codewords. However, the byte-error-correction capability of the TRS decoder is halved by switching over to a byte-error-location-and-correction decoding algorithm.

A/153 prescribes that the M/H-service information be subjected to outer convolutional coding and symbol interleaving before encapsulation in 188-byte transport-stream (TS) packets called "MHE packets" that are subjected to non-systematic (207, 187) Reed-Solomon coding to generate selected segments of 8-VSB data fields. These segments of 8-VSB data fields are time-division multiplexed with other segments generated by systematic (207, 187) Reed-Solomon coding of 188-byte TS packets of main-service information. The bytes of the resulting 8-VSB data fields are convolutionally interleaved before being subjected to the ⅔ trellis coding that functions as inner convolutional coding of the CCC used for transmissions to M/H receivers. All the segments of 8-VSB data fields have (207, 187) Reed-Solomon coding to insure that DTV receivers already in the field continue usefully to receive main-service information.

Some of those "legacy" DTV receivers place themselves in a "sleeping" mode if their decoders for (207, 187) R-S coding find a large enough portion of the segments of 8-VSB data fields to contain byte errors that cannot be corrected. The non-systematic (207, 187) Reed-Solomon coding of MHE packets has commonly been regarded as a loss of digital payload that is unfortunately necessitated to accommodate these "legacy" DTV receivers.

SUMMARY OF THE INVENTION

The inventor has perceived that the non-systematic (207, 187) Reed-Solomon codewords contain valuable information concerning the correctness of the outer convolutional coding of the serial concatenated convolutional coding (SCCC) used for transmitting M/H-service data. An M/H receiver can decode the non-systematic (207, 187) Reed-Solomon coded MHE packets before and during turbo decoding of the SCCC. The decoding results are used to influence the soft decisions concerning bits of the SCCC that arise during SCCC decoding procedures. The decoding results can sometimes correct errors in the outer convolutional coding of the SCCC. The decoding results can be employed to stop the iterative SCCC decoding procedures when satisfactory decoding results are achieved before having performed a prescribed maximum number of iterations.

Broadly considered, the invention establishes a new paradigm for the reception of convolutional coding of interleaved Reed-Solomon forward-error-correction (RS FEC) coding of data. A procedure for decoding soft symbols of the convolutional coding is preceded by decoding the RS FEC coding of de-interleaved bytes of the hard data bits and hard parity bits from soft symbols of the convolutional coding. The results of the decoding of RS FEC codewords found to be correctable is used to correct erroneous hard data bits and hard parity bits of the soft symbols of the convolutional coding. There is an upward adjustment of confidence levels concerning hard data bits and hard parity bits of the soft symbols of the convolutional coding contained within RS FEC codewords that the RS FEC decoding procedures correct or find to be initially correct. These adjustments facilitate the subsequent procedure for decoding the soft symbols of the convolutional coding.

BRIEF DESCRIPTION OF THE DRAWINGS

FIG. 6 is an informal flow chart illustrating the novel method of turbo decoding employed by the portion of the FIG. 1 M/H receiver apparatus depicted in FIG. 3.

FIG. 7 is an informal flow chart illustrating substeps of a cycle of SCCC decoding that is a respective step of the turbo decoding method of illustrated in FIG. 6.

FIG. 8 is an assembly drawing that shows how FIGS. 2, 3, 9 and 5 combine to provide a schematic diagram of alternative receiver apparatus for receiving M/H transmissions sent over the air.

FIG. 9 is a block schematic diagram of the portion of the FIG. 8 M/H receiver apparatus for decoding TRS codewords using the results of turbo decoding to locate byte errors for TRS decoding, and for de-randomizing the TRS decoding results to recover a transport stream of MPEG-2 data packets.

FIG. 22 is an assembly drawing that shows how FIG. 23 combines with each of the FIGS. 24, 25 and 26 to provide three informal flow charts illustrating the novel alternative methods of turbo decoding employed by the portion of the FIG. 1 M/H receiver apparatus depicted in FIG. 3, the portion of the FIG. 12 M/H receiver apparatus depicted in FIG. 11, and the portion of the FIG. 16 M/H receiver apparatus depicted in FIG. 15, respectively. FIGS. 23 and 24 together provide an informal flow chart that illustrates the method of turbo decoding employed by the portion of the FIG. 1 M/H receiver apparatus depicted in FIG. 3.

DETAILED DESCRIPTION

Figure 1:
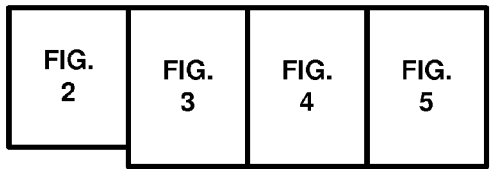
FIG. 1 is an assembly drawing that shows how FIGS. 2, 3, 4 and 5 combine to provide a schematic diagram of M/H receiver apparatus for receiving M/H transmissions sent over the air in accordance with A/153, which receiver apparatus is novel and embodies aspects of the invention.

FIG. 1 is an assembly drawing that shows how FIGS. 2, 3, 4 and 5 combine to provide a detailed schematic diagram of DTV receiver apparatus for receiving M/H transmissions sent over the air in accordance with A/153. The FIG. 2 portion of DTV receiver apparatus includes a vestigial-sideband amplitude-modulation (VSB AM) DTV receiver front-end 1 for selecting a radio-frequency DTV signal for reception, converting the selected RF DTV signal to an intermediate-frequency DTV signal, and for amplifying the IF DTV signal. An analog-to-digital converter 2 is connected for digitizing the amplified IF DTV signal supplied from the DTV receiver front-end 1. A demodulator 3 is connected for demodulating the digitized VSB AM IF DTV signal to generate a digitized baseband DTV signal. The receiver front-end 1, the ADC converter 2, and the VSB AM demodulator 3 combine to provide conversion apparatus for receiving a selected 8VSB signal as transmitted in 8VSB modulation of a radio-frequency carrier wave within a respective frequency channel and converting it to digital samples of a baseband signal. (Equivalent circuitry that digitizes baseband signal after analog demodulation of VSB AM signal is used in alternative embodiments of the DTV receiver apparatus.) The VSB AM demodulator 3 is connected to supply digital samples of a baseband signal to an adaptive channel-equalizer 4 for equalization of channel response. Synchronization signals extraction circuitry 5 is connected for receiving the response of the adaptive channel-equalizer 4. Responsive to data-field-synchronization (DFS) signals, the sync extraction circuitry 5 detects the beginnings of data frames and fields. Responsive to data-segment-synchronization (DSS) signals, the sync extraction circuitry 5 detects the beginnings of data segments. The FIG. 1 DTV receiver apparatus uses the DSS and DFS signals for controlling its operations similarly to the way this is conventionally done in DTV receivers. None of FIGS. 2, 3, 4 and 5 explicitly shows the circuitry for effecting these operations.

A decoder 6 for detecting the type of ancillary transmission responds to 8-bit sequences contained in final portions of the reserved portions of DFS signals separated by the sync extraction circuitry 5. The decoder 6 is connected for indicating the type of ancillary transmission to a decoding control unit 7 that controls turbo decoding of CCC and plural-dimensional decoding of RS Frames in the FIG. 1 DTV receiver apparatus. The type of ancillary transmission that the decoder 6 detects may be one that conditions the decoder 6 to extract further information concerning the ancillary transmission from the initial portions of the reserved portions of DFS signals separated by the sync extraction circuitry 5. The decoder 6 is connected for supplying such further information to the decoding control unit 7, which controls turbo decoding of SCCC and the plural-dimensional decoding of RS Frames. Most of the connections of the decoding control unit 7 to the elements involved in these decoding procedures are not explicitly shown in FIGS. 2, 3 and 4, so as to keep those figures from being too cluttered to be understood readily.

Figure 2:
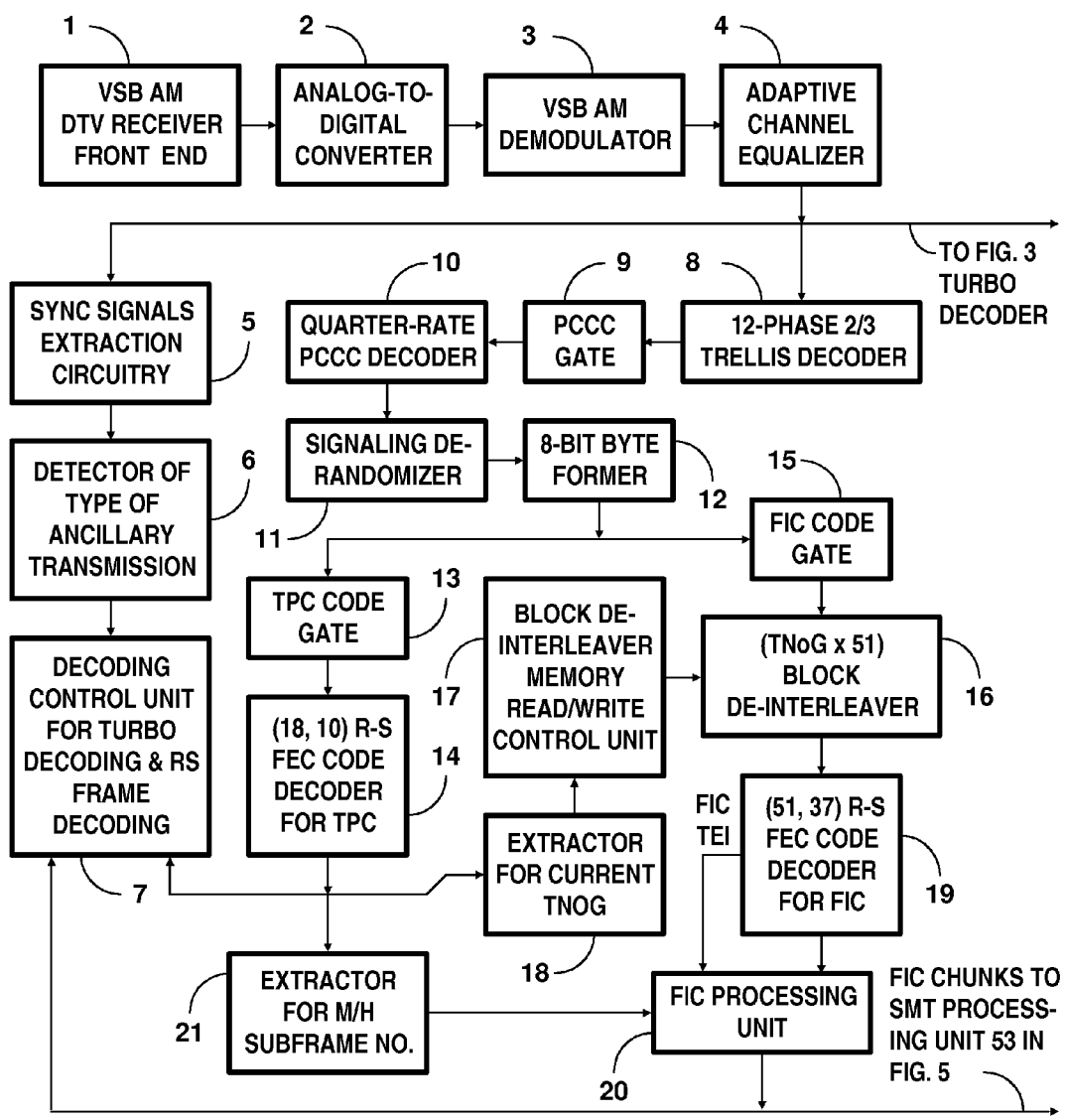
FIG. 2 is a block schematic diagram of the portions of the M/H receiver apparatus to recover baseband digital television signal, transmission parameter channel (TPC) signal and fast information channel (FIC) signal.

FIG. 2 shows a 12-phase trellis decoder 8 connected for receiving the response of the channel equalizer 4. The 12-phase trellis decoder 8 is connected for supplying trellis-decoding results to a PCCC gate 9 connected for extracting the PCCC'd signaling within each Group and reproducing the PCCC'd signaling for application as input signal to a decoder 10 for quarter-rate PCCC. The decoder 10 reproduces randomized signaling decoded (possibly with some errors) from the quarter-rate PCCC supplied thereto and is connected for supplying that randomized signaling as input signal to a signaling de-randomizer 11. The signaling de-randomizer 11 is connected for supplying de-randomized signaling to an 8-bit byte former 12. A TPC code gate 13 is connected for extracting bytes of TPC code from bytes of the de-randomized signaling supplied by the byte former 12 and supplying those extracted bytes of TPC code as input signal to a decoder 14 for (18, 10) Reed-Solomon coding. The decoder 14 recovers TPC information and is connected for supplying the TPC information to the decoding control unit 7 and to other elements of the receiver apparatus. The decoding control unit 7 is able to respond to the TPC information to control selection of the type of outer convolutional decoding to be used on SCCC portions of each M/H Group.

FIG. 2 shows an FIC code gate 15 connected for extracting byte-interleaved FIC code bytes from the bytes of de-randomized signaling supplied by the byte former 12 and reproducing those extracted bytes for application as input signal to a block de-interleaver 16. The block de-interleaver 16 is of matrix type and complements the block interleaving done at the transmitter, as prescribed in A/153. In this specification (over)writing refers both to memory writing procedures in which storage locations are empty of content when written by new content and to memory writing procedures in which storage locations have their original contents overwritten by new content. The block de-interleaver 16 is essentially a byte-organized random access memory (RAM) with byte-storage locations arrayed in rows and columns to be (over)written and read in accordance with addressing and read/write control signals supplied from a block de-interleaver memory read/write control unit 17. The byte-storage locations are arrayed in 51-byte rows for being (over)written by RS-coded FIC data from respective Groups within each M/H subFrame. The memory read/write control unit 17 needs to know the total number of Groups, TNoG, within each M/H subFrame in order to know the number of these 51-byte rows. The memory read/write control unit 17 uses this knowledge to control the addressing of successive columns of TNoG byte-storage locations when writing to them. An extractor 18 is connected to extract TNoG for the current M/H subFrame (current_TNoG) from the response of the decoder 14 of the (18, 10) Reed-Solomon coded TPC data. The value of current_TNoG appears NoG times in the TPC data recovered by the decoder 14 from the previous M/H Sub-Frame. The extractor 18 selects from the TPC data those bit sequences descriptive of current_TNoG estimates and decides the value of current_TNoG based on the majority of concurring estimates. The extractor 18 is connected to supply that value of current_TNoG to the memory read/write control unit 17.

After the final Group of each M/H subFrame concludes, the memory read/write control unit 17 generates read addresses for reading rows of 35×TNoG bytes from the RAM in the block de-interleaver 16. The reading is completed before the initial Group of the next M/H Sub-Frame begins and the contents of the memory in the block de-interleaver 16 will be overwritten. The block de-interleaver 16 is connected for supplying its de-interleaved FIC code response as input signal to a decoder 19 for (51, 37) Reed-Solomon coding. The decoder 19 recovers FIC information and is connected for supplying that FIC information to an FIC processing unit 20 together with a respective FIC Transport Error Indication (TEI) bit concerning each (51, 37) Reed-Solomon codeword. The FIC TEI bit generated by the decoder 19 is a ONE whenever byte error(s) that cannot be corrected are detected within a (51, 37) Reed-Solomon codeword, but is a ZERO if such byte error(s) are not detected. E. g., an FIC TEI bit is likely to be generated if there is a momentary fade in received radio-frequency signal strength.

An extractor 21 extracts the current M/H Sub-Frame number from the response of the decoder 14 of the (18, 10) Reed-Solomon coded TPC data and supplies that M/H Sub-Frame number to the FIC-Chunk processing unit 20. The current M/H subFrame number appears NoG times in the TPC data recovered by the decoder 14 from the current M/H Sub-Frame. The extractor 21 selects from the TPC data those bit sequences descriptive of current M/H subFrame number estimates and decides the value of current M/H Sub-Frame number based on the majority of concurring estimates. The current M/H Sub-Frame number aids the FIC-Chunk processing unit 20 in its parsing of FIC Chunks, particularly the extended FIC Chunks, that the decoder 19 for (51, 37) Reed-Solomon coding supplies. The FIC-Chunk processing unit 20 is connected for supplying processed FIC Chunks to the decoding control unit 7. (FIG. 2 indicates that processed FIC Chunks from the FIC-Chunk processing unit 20 are supplied to an SMT-MH processing unit 53 shown in FIG. 5, where they are integrated with SMT-MH information during the generation of Service Map Data written to a memory 54 for temporary storage therewithin.)

Figure 3:
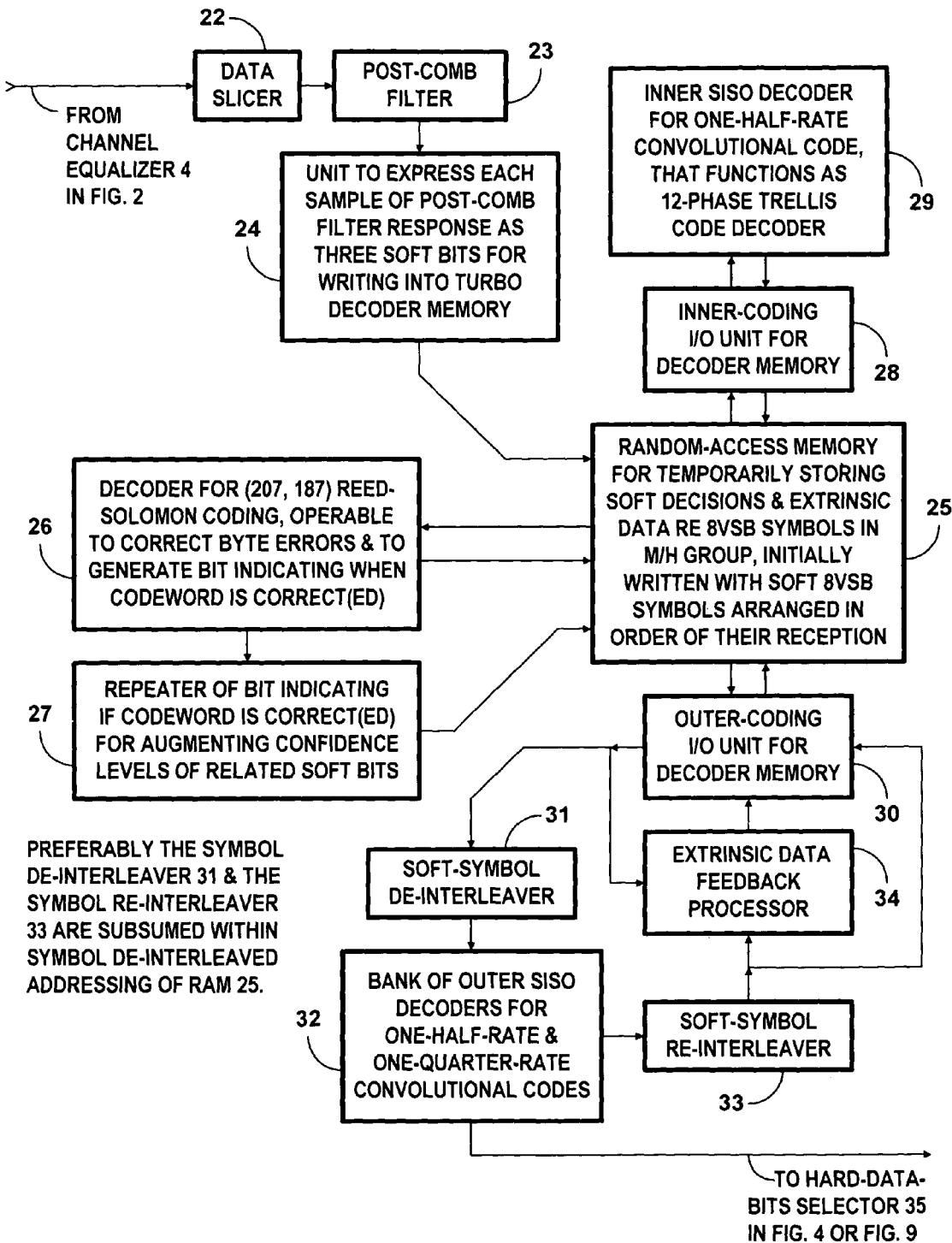
FIG. 3 is a block schematic diagram of the portion of the M/H receiver apparatus for turbo decoding baseband digital television signal to recover portions of transverse Reed-Solomon (TRS) codewords, which FIG. 3 portion of the M/H receiver apparatus is novel and provides improved turbo decoding in accordance with aspects of the invention.

FIG. 3 shows the turbo decoding circuitry for SCCC transmissions made at one-half or one-quarter the code rate of the ⅔trellis coding of ordinary 8-VSB DTV data. The adaptive channel-equalizer 4 in FIG. 2 is connected to supply its response at Nyquist rate to a data slicer 22 in FIG. 3. The data slicer 22 is operable to supply soft data bits responsive to the channel-equalizer 4 response that the data slicer 22 receives as input signal thereto. The data slicer 22 is connected to supply these soft data bits to a post-comb filter 23. FIG. 3 shows the post-comb filter 23 connected for supplying its response to a unit 24 for expressing each sample of post-comb filter 23 response as three soft bits for writing to a random-access memory 25. The RAM 25 has a sufficient number of addressable storage locations for temporarily storing X-sub-2, Z-sub-1 and Z-sub-0 soft bits concerning all of the samples of post-comb filter 23 response in at least the 170 data segments of a single M/H Group. These addressable storage locations have additional temporary storage capability for storing soft extrinsic data concerning the X-sub-2 and Z-sub-1 bits involved in the outer convolutional coding of the SCCC used for transmitting M/H data.

In accordance with an aspect of the invention, the non-systematic (207, 187) RS codewords of an M/H Group stored in the RAM 25 are read therefrom at the beginning of at least some cycles of turbo decoding the M/H Group, preferably including the initial cycle of turbo decoding the M/H Group, for application to a decoder 26 for the non-systematic (207, 187) RS codewords. If the decoder 26 finds a non-systematic (207, 187) RS codeword contains a number of byte errors that can be corrected, the byte errors in the RS codeword are corrected. The RS codeword is then written back into the RAM 25 to replace the original RS codeword.

In accordance with a further aspect of the invention, the decoder 26 generates a respective bit indication as to whether or not each non-systematic (207, 187) RS codeword read thereto from the RAM 25 is correct or has been corrected. The decoder 26 is connected to supply these bit indications to a repeater 27 that repeats the bit indication regarding each non-systematic (207, 187) RS codeword to accompany each consecutive pair of bits in the codeword. This repeated bit indication indicates whether or not the X-sub-2 and Z-sub-1 bits of that pair were included in a non-systematic (207, 187) RS codeword that the decoder 26 found to be correct. These repeated bit indications are written to the RAM 25 concurrently with the decoder 26 writing that non-systematic (207, 187) RS codeword back into the RAM 25 to replace the original RS codeword. These repeated bit indications supply additional information concerning the level of confidence in the respective X-sub-2 and Z-sub-1 bits of each symbol of the outer convolutional coding of the SCCC used for transmitting M/H data that can be helpful in the decoding of the outer convolutional coding. The additional information concerning the level of confidence in the respective Z-sub-1 bit of each symbol can also be helpful in the decoding of the inner convolutional coding of the SCCC used for transmitting M/H data.

The remainder of each cycle of SCCC decoding is performed analogously to prior-art practice, although connections to establish a turbo decoding loop are made via the RAM 25. The soft-input/soft-output (SISO) decoders used in the turbo decoding preferably use the sliding-window log-MAP algorithm. The term "log-MAP" is short for "logarithmic maximum a posteriori". The one-half-rate convolutional coding used in the two-thirds-rate trellis coding of main-service data and used as the inner convolutional coding of the SCCC transmitting M/H-service data is decoded in each cycle of turbo decoding before the outer convolutional coding of the SCCC is decoded thereafter in the cycle.

An inner-coding input/output unit 28 selectively connects the RAM 25 with an inner soft-input/soft-output decoder 29 for one-half-rate convolutional coding. The RAM 25 reads the 170 successive convolutionally byte-interleaved data segments of an M/H Group in the order they were originally received to the inner-coding I/O unit 28, which responds to supply input signal to the SISO decoder 29. The SISO decoder 29 decodes the one-half-rate convolutional coding used in the two-thirds-rate trellis coding of main-service data and used as the inner convolutional coding of the SCCC transmitting M/H-service data. The 2-bit symbols of the inner convolutional coding, each composed of respective Z-sub-1 and Z-sub-0 soft bits, are read from the RAM 25 along with any extrinsic data concerning the soft Z-sub-1 bits. (In SCCC the soft Z-sub-1 bits are parity bits, rather than data bits, so what is termed "extrinsic data" is actually extrinsic parity information.) Any extrinsic data concerning the soft Z-sub-1 bits in SCCC transmission are additively combined with the soft Z-sub-1 bits in the inner-coding I/O unit 28 to generate adjusted soft Z-sub-1 bits. The inner-coding I/O unit 28 supplies these adjusted soft Z-sub-1 bits, along with Z-sub-0 soft bits as read from the RAM 25; in a stream of soft 2-bit symbols supplied to the SISO decoder 29 as input signal. The SISO decoder 29 is connected to supply at least the soft Z-sub-1 bits in its decoding results to the inner-coding I/O unit 28, which applies these soft Z-sub-1 bits to the RAM 25 as at least part of a write input signal. The soft Z-sub-1 bits that the inner-coding I/O unit 28 applies to the RAM 25 over-write the Z-sub-1 bits previously stored in the RAM 25.

Outer coding input/output circuitry 30 is used for accessing selected portions of the RAM 25 that contain soft-decisions related to the interleaved outer convolutional coding of the SCCC. Responsive to control by the decoding control unit 7, the input/output circuitry 30 is operable to read soft symbols of the reproduced symbol-interleaved outer convolutional coding of the SCCC from the RAM 25 to the input port of a soft-symbol de-interleaver 31. Each of these soft symbols is composed of a respective soft X-sub-2 bit and a respective soft Z-sub-1 bit.

The soft-symbol de-interleaver 31 is connected for de-interleaving the symbol-interleaved outer convolutional coding of the SCCC and supplying soft-decisions related to the de-interleaved outer convolutional coding to the one of a bank 32 of outer SISO decoders selected by the decoding control unit 7 to perform. The selected one of the bank 32 of outer SISO decoders is connected for supplying the soft symbols of its decoding results to a soft-symbol re-interleaver 33, which is complementary to the soft-symbol de-interleaver 31. An extrinsic-data-feedback processor 34 is operable for comparing the soft Z-sub-1 bits in the symbol-interleaved decoding results from the soft-symbol re-interleaver 33 with soft Z-sub-1 bits read from the RAM 25 via the outer-coding I/O unit 30. Such comparison generates extrinsic data concerning those of the soft Z-sub-1 bits that are temporarily stored in the RAM 25 as part of the SCCC used to transmit M/H-service data. The extrinsic data feedback processor 34 is connected to feed this extrinsic data back through the input/output circuitry 30 to replace any previous extrinsic data that is temporarily stored in selected portions of the RAM 25. That is, in the addressed storage locations in the RAM 25 that temporarily store information concerning SCCC within the M/H Group (or portion of thereof) that is being turbo decoded. The soft X-sub-2 bits and the soft Z-sub-1 bits in the symbol-interleaved decoding results from the soft-symbol re-interleaver 33 are also supplied to the outer-coding I/O unit 30 to over-write previous soft X-sub-2 bits and soft Z-sub-1 bits of SCCC temporarily stored in the RAM 25.

Thusfar, the symbol de-interleaving to recover outer convolutional coding to be decoded and the symbol re-interleaving subsequent to decoding the outer convolutional coding have been described, presuming that such operations are carried out with the addressed storage locations in the RAM 25 that relate to SCCC being read from and written to in order of their original writing. In such case, the symbol de-interleaver 31 and the symbol re-interleaver 33 require actual physical structures separate from the RAM 25. Actual separate physical structures for the symbol de-interleaver 31 and the symbol re-interleaver 33 undesirably require a substantial amount of memory in the construction of each of them. The symbol de-interleaver 31 and the symbol re-interleaver 33 could be subsumed into common memory within the bank 32 of outer SISO decoders. Preferably though, symbol de-interleaving and symbol re-interleaving can be carried out by suitable addressing of the storage locations already in the RAM 25, which storage locations temporarily store samples of the outer convolutional coding of the SCCC used for transmitting M/H-service data. There is then no need to have a symbol de-interleaver with actual physical structure to symbol de-interleave outer convolutional coding to be decoded. Nor is there then need to have a symbol re-interleaver with actual physical structure to symbol interleave the results of decoding the outer convolutional coding or the extrinsic data.

Figure 4:
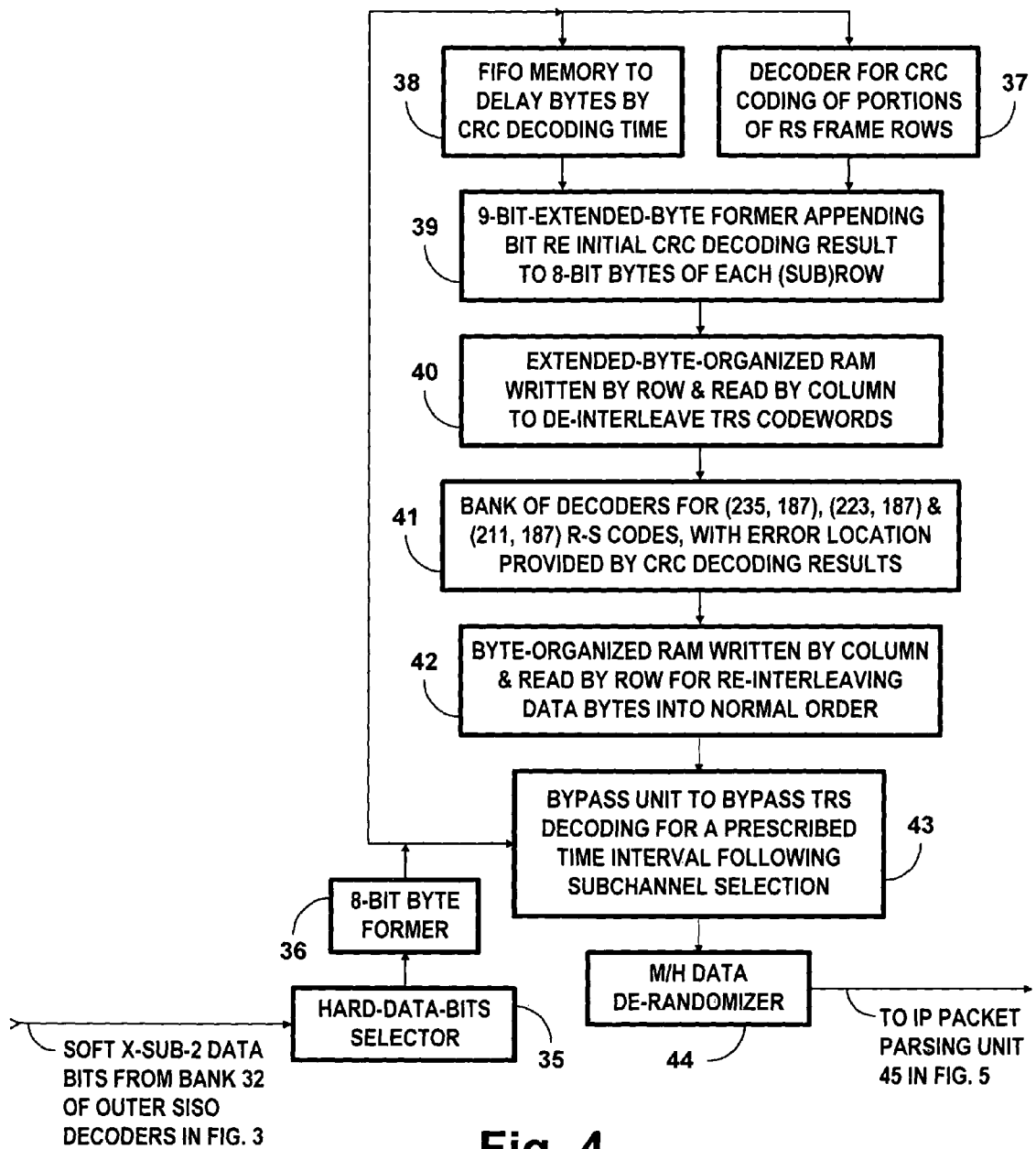
FIG. 4 is a block schematic diagram of the portion of the M/H receiver apparatus for decoding cyclic redundancy check (CRC) codes in the turbo decoding results, decoding TRS codewords using the results of CRC decoding to locate byte errors for TRS decoding, and de-randomizing the TRS decoding results to recover a transport stream of MPEG-2 data packets.

Referring to FIG. 4, a hard-data-bits selector 35 has an input port connected for receiving soft X-sub-2 data bits from the output port of the bank 32 of outer SISO decoders. The hard-data-bits selector 35 has an output port connected for supplying an 8-bit-byte former 36 with hard data bits selected from respective ones of the soft X-sub-2 data bits. In its response the 8-bit-byte former 36 forms the hard X-sub-2 data bits received from the hard-data-bits selector 35 into eight-bit bytes.

Successions of these 8-bit bytes that will be used for reproducing respective rows of bytes in RS Frames are supplied to a decoder 37 for cyclic-redundancy-check (CRC) coding and to a byte-organized first-in, first-out memory 38. Each row of bytes for an RS Frame has a 2-byte checksum appended to the conclusion thereof, thus to form a CRC codeword. After the decoder 37 has received each complete CRC codeword, the decoder 37 generates a bit indicating whether or not it found the row of bytes for an RS Frame contained within the CRC codeword to contain error. The FIFO memory 38 reproduces each successive row of bytes for an RS Frame it receives, as delayed for the duration of the CRC codeword containing that row of bytes, and supplies those delayed 8-bit bytes to a nine-bit-extended-byte former 39. The extended-byte former 39 appends to each of the 8-bit bytes the bit indicating whether or not the decoder 37 found the CRC codeword that it was contained in to contain error.

Figure 19:
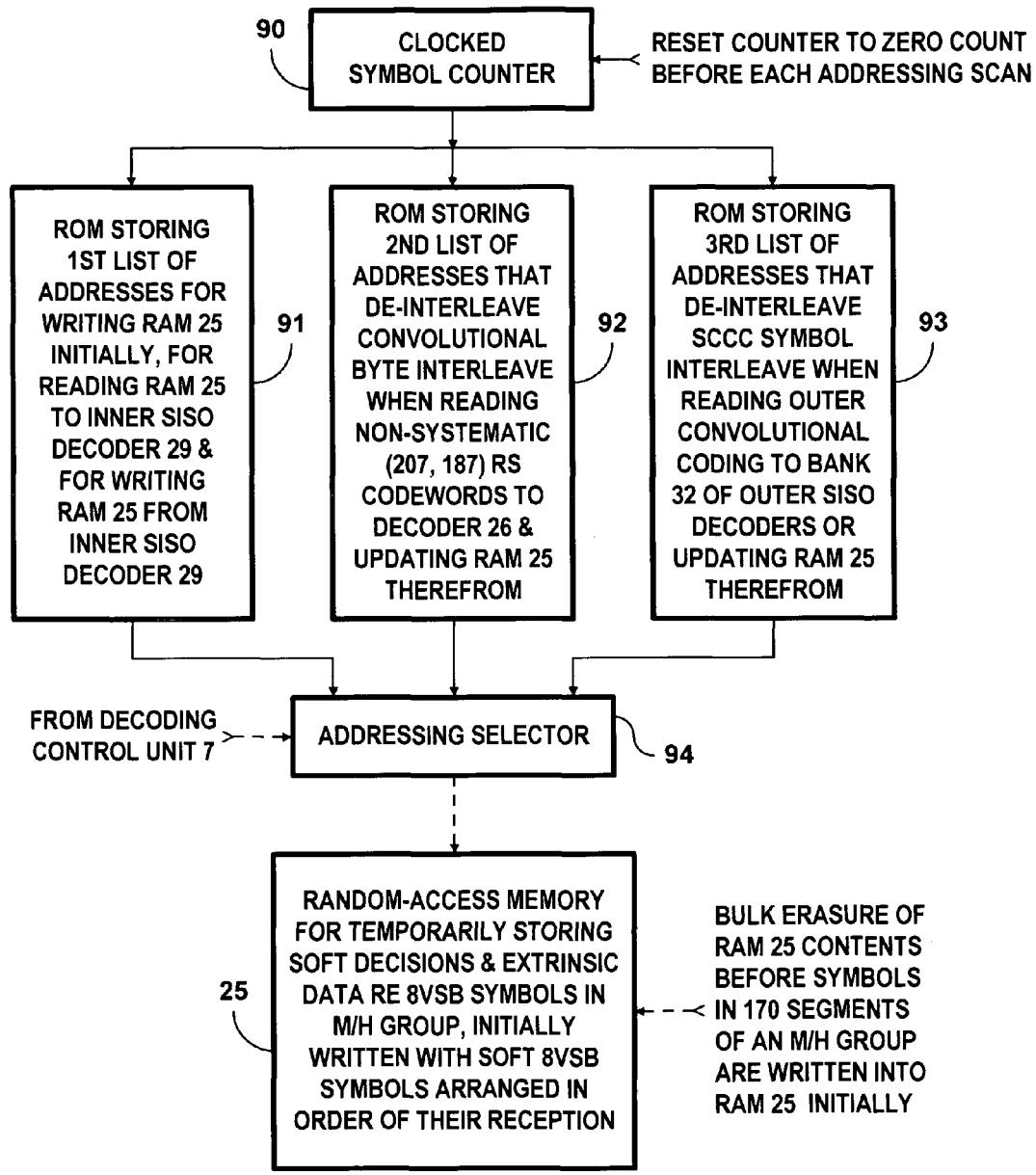
FIG. 19 is a block schematic diagram showing a representative arrangement of elements for addressing the random-access memory that FIGS. 3, 11 and 15 include to support turbo decoding.

The resulting extended bytes are written row by row into respective rows of extended-byte storage locations in a random-access memory 40 operated to perform the matrix-type block de-interleaving procedure that is a first step of the TRS decoding routine. The RAM 40 is subsequently read one column of 9-bit extended bytes at a time to a selected one of a bank 41 of decoders for (235, 187), (223, 187) and (211, 187) Reed-Solomon codes, respectively. A/153 prescribes these (235, 187), (223, 187) and (211, 187) RS codes for TRS coding. The decoding control unit 7 selects the appropriate decoder in response to information extracted from the TPC. The extension bits accompanying the 8-bit bytes of the TRS coding are used to help locate byte errors for decoding the TRS coding, as is described in further detail in the published patent application US-2010-0293433-A1, with reference to FIG. 36 of its drawings. Such previous location of byte errors facilitates successful use of a Reed-Solomon algorithm capable of correcting more byte errors than an algorithm that must locate byte errors as well as correct them. The 8-bit data bytes that have been corrected insofar as possible by the selected one of the RS decoders in the bank 41 are written, column by column, into respective columns of byte-storage locations of a random-access memory 42. The RAM 42 is operated to perform the matrix-type block re-interleaving procedure for data in further steps of the TRS decoding routine. In a final step of the TRS decoding routine, the byte-storage locations in the RAM 42 are read from row-by-row for supplying reproduced randomized M/H data to a bypass unit 43. The bypass unit 43 usually relays this reproduced randomized M/H data to an M/H data de-randomizer 44 shown in FIG. 5. The bypass unit 43 is connected to bypass TRS decoding for a prescribed time interval following selection of a new sub-channel for reception, however, supplying the data de-randomizer 44 with bytes of randomized M/H data taken directly from the response of the byte former 36. A representative construction of the bypass unit 43 is shown in FIG. 19 of patent application US-2010-0100793-A1 of A. L. R. Limberg published 22 Apr. 2010 and titled "Digital television systems employing concatenated convolutional coded data".

Figure 5:
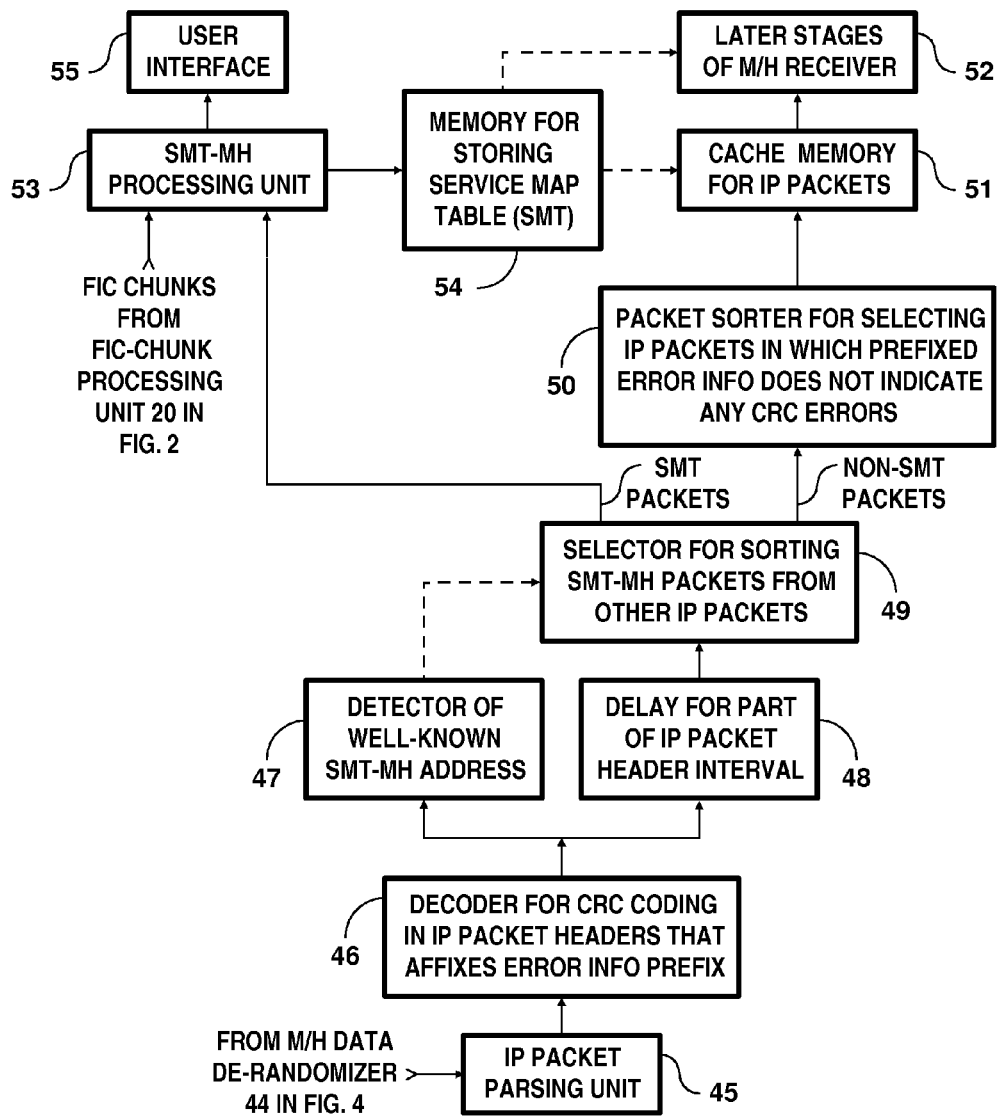
FIG. 5 is a block schematic diagram of the portion of the M/H receiver apparatus for parsing data from the transport stream of MPEG-2 data packets to recover a transport stream of internet-protocol (IP) data packets.

Referring now to FIG. 5, the M/H data de-randomizer 44 is connected for receiving the output signal from the bypass unit 43 in FIG. 4. The M/H data de-randomizer 44 de-randomizes the bytes of that signal by converting them to serial-bit form and exclusive-ORing the bits with a pseudo-random bit sequence prescribed in A/53 and A/153. The M/H data de-randomizer 44 converts the de-randomized bits into bytes of M/H data and supplies those bytes to a parsing unit 45 for parsing the data stream into internet-protocol (IP) packets. The IP-packet parsing unit 45 performs this parsing responsive to two-byte row headers respectively transmitted at the beginning of each row of IP data in the RS Frame. This row header indicates where the earliest start of an IP packet occurs within the row of IP data bytes within the RS Frame. If a short IP packet is completely contained within a row of the RS Frame, the IP-packet parsing unit 45 calculates the start of a later IP packet proceeding from the packet length information contained in the earlier IP packet within that same row of the RS Frame.

The IP-packet parsing unit 45 is connected for supplying IP packets to a decoder 46 for cyclic-redundancy-check coding within the IP packets. Each IP packet contains a two-byte, 16-bit checksum for CRC coding that IP packet. The decoder 46 is constructed to preface each IP packet that it reproduces with a prefix bit indicating whether or not error has been detected in that IP packet. The decoder 46 is connected to supply these IP packets as so prefaced to a detector 47 of a "well-known" SMT-MH address and to a delay unit 48. The delay unit 48 delays the IP packets supplied to a packet selector 49 for selecting SMT-MH packets from other IP packets. The delay unit 48 provides delay of a part of an IP packet header interval, which delay is long enough for the detector 47 to ascertain whether or not the "well-known" SMT-MH address is detected.

If the detector 47 does not detect the "well-known" SMT-MH address in the IP packet, the detector 47 output response conditions the packet selector 49 to reproduce the IP packet for application to a packet sorter 50 as input signal thereto. The packet sorter 50 sorts out those IP packets in which the preface provides no indication of CRC coding error for writing to a cache memory 51 for IP packets. The prefatory prefix bit before each of the IP packets indicating whether there is CRC code error in its respective bytes is omitted when writing the cache memory 51. The cache memory 51 temporarily stores at least those IP packets not determined to contain CRC code error for possible future reading to the later stages 52 of the receiver. These later stages 52 of the receiver are sometimes referred to as the "upper layers" of the receiver.

If the detector 47 does detect the "well-known" SMT-MH address in the IP packet, establishing it as an SMT-MH packet, the detector 47 output response conditions the packet selector 49 to reproduce the SMT-MH packet for application to an SMT-MH processing unit 53, which includes circuitry for generating control signals for the later stages 52 of the M/H receiver. FIG. 5 shows the SMT-MH processing unit 53 connected for receiving FIC information from the FIC processing unit 20 in FIG. 2. The SMT-MH processing unit 53 integrates this FIC information with information from SMT-MH packets during the generation of Service Map Data. The Service Map Data generated by the SMT-MH processing unit 53 is written into memory 54 for temporary storage therewithin and subsequent application to the later stages 52 of the M/H receiver. The SMT-MH processing unit 53 relays those SMT-MH packets that have bit prefixes that do not indicate error in the packets to a user interface 55, which includes an Electronic Service Guide (ESG) and apparatus for selectively displaying the ESG on the viewing screen of the M/H receiver. Patent application US-2010-0061465-A1 of A. L. R. Limberg published 11 Mar. 2010 and titled "Sub-channel acquisition in a digital television receiver designed to receive Mobile/Handheld signals" provides more detailed descriptions of the operations of the portion of an M/H receiver shown in FIG. 5. The description with reference to the drawing FIGS. 12, 13 and 14 of that application describe operations relying on the SMT-MH tables available in A/153.

FIG. 6 is an informal flow chart illustrating an improved method of turbo decoding employed by the portion of the FIG. 1 M/H receiver apparatus depicted in FIG. 3. In an initial step 101 of the method, samples of the 8-VSB signal are post-comb filtered and data-sliced to recover soft X-sub-2 bits, soft Z-sub-1 bits and soft Z-sub-0 bits. FIG. 3 shows the post-comb filter 23 connected for performing the post-comb filtering in the digital regime. The input port of the data slicer 22 is connected for receiving Nyquist-rate samples of the baseband adaptive channel-equalizer 4 response, and the output port of the data slicer 22 connects to the input port of the post-comb filter 23. The post-comb filter 23 delays its input signal twelve sample epochs to be added to its current input signal, and the resulting digital sum signal must be data-sliced so as to be expressed in modulo-8 format for turbo decoding. The post-comb filter 23 is data-sliced by the unit 24 for expressing each sample of the post-comb filter response as three soft bits to be written into addressed storage locations within the RAM 25. The three soft bits are a soft X-sub-2 bit, a soft Z-sub-1 bit and a soft Z-sub-0 bit. A number of alternative ways of implementing the step 101 at the beginning of decoding an 8-VSB signal are known to those skilled in the art. E. g., the post comb-filtering can be done in the analog regime before digitization of the 8-VSB signal and subsequent data-slicing thereof. Post comb-filtering in the analog regime is customarily done before channel equalization, rather than after.

However the initial step 101 of the FIG. 6 method is performed, the step 101 is followed by a step 102 of loading each set of three soft bits descriptive of a Nyquist-rate sample of post-comb filtered 8-VSB signal into a respective one of the addressed storage locations within turbo decoder memory. In the FIG. 3 turbo decoding circuitry, the RAM 25 functions as turbo decoder memory.

FIG. 6 shows a next step 103 of the improved turbo decoding method, wherein the contents of the addressed storage locations within turbo decoder memory are read using addressing that de-interleaves the convolutional byte interleaving of baseband 8-VSB signal. This is done to recover each of the 118 non-systematic (207, 187) RS codewords of the M/H Group temporarily stored in turbo decoder memory.

FIG. 6 shows a next step 104 of the improved turbo decoding method, wherein byte errors in each of the 118 non-systematic (207, 187) RS codewords are decoded and corrected insofar as possible. In the FIG. 3 turbo decoding circuitry, the decoder 26 for non-systematic (207, 187) RS codewords performs this part of the step 104. The step 104 is a compound step in which indications are generated as to whether or not each byte of the non-systematic (207, 187) RS codewords is from an RS codeword that is correct at the conclusion of the step 104. In this part of the step 104, the decoder 26 generates a respective bit indicating whether or not each RS codeword processed by the decoder 26 will be correct at the conclusion of the step 104. Then, the repeater 27 generates a respective bit for each byte indicating whether or not that byte is correct.

FIG. 6 shows a next step 105 of the improved turbo decoding method, wherein the bytes of non-systematic (207, 187) RS codewords are re-interleaved for being written back to turbo decoding memory after decoding and possible correction. The re-interleaved bytes, together with appended indications as whether each byte is correct, update the temporarily stored contents of the turbo decoding memory.

The steps 103, 104 and 105 provide the crux of the improvement in the FIG. 6 method of turbo decoding. FIG. 6 shows these steps being carried out successively, processing 118 consecutive non-systematic (207, 187) RS codewords from each M/H Group as a group, rather than individually. This facilitates understanding the general concept of what the improvement is in the turbo decoding method. In the FIG. 3 turbo decoding circuitry, however, processing 118 consecutive non-systematic (207, 187) RS codewords as a group, rather than individually, requires the RS decoder 26 to have a considerable amount of memory of its own. This memory is needed to temporarily store each RS codeword as it is corrected until such time as the group of corrected RS codewords is written back to turbo decoding memory to update the contents temporarily stored therein. Preferably, the steps 103, 104 and 105 are performed sequentially for each non-systematic (207, 187) RS codeword read from turbo decoding memory. In the FIG. 3 turbo decoding circuitry, such procedure substantially reduces the requirement for memory in the RS decoder 26. Such procedure moves to the RAM 25, serving as turbo decoding memory, the temporary storage of non-systematic (207, 187) RS codewords required after their correction insofar as possible by the RS decoder 26. The temporary storage of the non-systematic (207, 187) RS codewords after processing by the RS decoder 26 updates addressed storage locations in the RAM 25, without requiring additional byte storage capability.

After the steps 103, 104 and 105 are carried out for all 118 consecutive non-systematic (207, 187) RS codewords from an M/H Group, one cycle of SCCC decoding is performed in step 107 of the improved method of SCCC decoding shown in FIG. 6. If the cycle of SCCC decoding performed in step 107 is not the sole one nor the final iteration of a series of SCCC decoding cycles in a turbo decoding procedure, the results from this cycle of SCCC decoding provide turbo feedback for a subsequent step 108. In the step 108 the extrinsic data concerning soft X-sub-2 bits and soft Z-sub-1 bits that are temporarily stored in the turbo decoding memory are updated dependent on the turbo feedback provided by the immediately preceding step 107. The step 108 concludes one cycle of SCCC decoding and begins the next cycle of SCCC decoding in which the step 108 is followed by repeated steps 103, 104 and 105. In the FIG. 3 turbo decoding circuitry, each step 107 is carried out using the elements 28-33 together with the RAM 25. The extrinsic-data-feedback processor 34 implements each step 108 in conjunction with the RAM 25 and the outer-coding I/O unit 30. The step 107 is followed by a step 109 if the cycle of SCCC decoding performed in step 107 is the sole one or is the final iteration of a series of SCCC decoding cycles in a turbo decoding procedure. In step 109 the results from this cycle of SCCC decoding that contain portions of TRS codewords are forwarded to RS Frame storage memory.

FIG. 7 is an informal flow chart illustrating substeps of a cycle of SCCC decoding that is a respective step 107 of the FIG. 6 turbo decoding method. In an initial substep 111 successive symbols of inner convolutional coding, each composed of a respective soft Z-sub-1 bit and a respective soft Z-sub-0 bit, are read from the turbo decoding memory to be decoded in a succeeding substep 112. In the FIG. 3 turbo decoding circuitry, successive soft Z-sub-1 bits and soft Z-sub-0 bits are read from the RAM 25 via the inner-coding I/O unit 28 to the inner SISO decoder 29 to be decoded.

In a succeeding substep 113 of the cycle of SCCC decoding, the turbo decoding memory is updated by the soft Z-sub-1 bits resulting from the substep 112 of decoding the inner convolutional coding of the SCCC.

In a succeeding substep 114 of the cycle of SCCC decoding, successive symbols of outer convolutional coding, each composed of a respective soft X-sub-2 bit and a respective soft Z-sub-1 bit, are read from the turbo decoding memory together with any extrinsic data regarding the soft Z-sub-1 bits. The extrinsic data are differentially combined with the soft Z-sub-1 bits generated by decoding the inner convolutional coding, thus to generate the soft Z-sub-1 bits of the outer convolutional coding to be decoded. In the FIG. 3 circuitry, successive soft X-sub-2 bits, soft Z-sub-1 bits and any extrinsic data regarding the soft Z-sub-1 bits are read from the RAM 25 via the outer-coding I/O unit 30 to a selected one of the outer SISO decoders in the bank 32 of them. The outer-coding I/O unit 30 differentially combines any extrinsic data regarding the soft Z-sub-1 bits with the soft Z-sub-1 bits as read from the RAM 25. This generates the soft Z-sub-1 bits that accompany soft X-sub-2 bits in the outer convolutional coding that the outer-coding I/O unit 30 supplies to the bank 32 of outer SISO decoders for decoding. Preferably, the RAM 25 is addressed so as to provide symbol de-interleaving for the outer convolutional coding and thereby subsume the function of the separate soft-symbol de-interleaver 31 that FIG. 3 shows.

In a next substep 115 of the cycle of SCCC decoding, the outer convolutional coding is decoded. In the FIG. 3 circuitry, the outer convolutional coding is decoded by the selected one of the outer SISO decoders in the bank 32 of them.

If the step 107 of the FIG. 6 method performs an earlier one of the cycles of SCCC decoding in the FIG. 6 turbo decoding method, substep 115 of the cycle of SCCC decoding is followed by a substep 116 of generating extrinsic data concerning soft Z-sub-1 bits. The extrinsic data are generated by differentially combining the soft Z-sub-1 bits of the outer convolutional coding as supplied for SISO decoding from the soft Z-sub-1 bits resulting from such decoding. Then, in a substep 117 of the cycle of SCCC decoding, the extrinsic data concerning soft Z-sub-1 bits generated in the substep 116 replace the extrinsic data that were temporarily stored in turbo decoder memory previously. The substep 116 is a compound step in which the soft X-sub-2 bits and soft Z-sub-1 bits resulting from decoding the outer convolutional coding also update the soft X-sub-2 bits and soft Z-sub-1 bits temporarily stored in turbo decoder memory. This is a departure from the customary practice in turbo decoding SCCC of simply retaining the soft X-sub-2 bits in local memory associated with the outer SISO decoder.

Updating the soft X-sub-2 bits and soft Z-sub-1 temporarily stored in turbo decoder memory provides for both the soft X-sub-2 bits and the soft Z-sub-1 bits to have been updated in each cycle of SCCC decoding by the time that cycle finishes. Then, in a substep 118, with the cycle of decoding SCCC being finished, processing proceeds to the next cycle of the FIG. 6 turbo decoding method. Since both the soft X-sub-2 bits and the soft Z-sub-1 have been updated, the steps 103, 104 and 105 of the next cycle of the FIG. 6 turbo decoding method can proceed with updated hard X-sub-2 bits and with updated hard Z-sub-1 bits in the non-systematic (207, 187) RS codewords. This is the reason for updating the soft X-sub-2 bits temporarily stored in the RAM 25 at the close of an SCCC decoding cycle.

In the FIG. 3 circuitry, the substep 116 of generating extrinsic data concerning soft Z-sub-1 bits is performed by the extrinsic-data-feedback processor 34. Preferably, the RAM 25 is addressed so as to provide symbol re-interleaving for the results of decoding outer convolutional coding and thereby subsume the function of the separate soft-symbol re-interleaver 33 that FIG. 3 shows. Previously stored Z-sub-1 bits are read from the RAM 25 one at a time to the extrinsic-data-feedback processor 34 to be differentially combined with the Z-sub-1 bits resulting from the selected one of the bank 32 of outer SISO decoders decoding outer convolutional coding. Then, in the substep 117 the resulting extrinsic datum related to a respective soft Z-sub-1 bit over-writes any previous extrinsic datum temporarily stored in the addressed storage location in the RAM 25. The soft X-sub-2 bit decoded from the same symbol of outer convolutional coding as the soft Z-sub-1 bit used to generate the extrinsic datum over-writes the previous soft X-sub-2 bit temporarily stored in the appropriate addressed storage location in the RAM 25. The soft Z-sub-1 bit used to generate the extrinsic datum over-writes the previous soft Z-sub-1 bit temporarily stored in the appropriate addressed storage location in the RAM 25. FIG. 3 shows the soft X-sub-2 bits and soft Z-sub-1 bits used for such over-writing routed around the extrinsic data feedback processor 34 to the outer-coding I/O unit 30 and thence to the RAM 25 as part of its write signal.

If the step 107 of the FIG. 6 method performs the sole cycle of decoding the SCCC of an M/H Group or the final cycle of a series of iterated turbo decoding cycles for decoding the SCCC of an M/H Group, the substep 115 of decoding the outer convolutional coding to generate decoding results is followed by a substep 119 of processing the soft X-sub-2 bits in those results to get the ultimate SCCC decoding results. This substep 119 includes the selection of hard data bits from those bits descriptive of soft X-sub-2 bits and further includes the formation of 8-bit bytes from the hard data bits after their selection. FIG. 4 shows the hard-data-bits selector 35 connected for the selection of the hard data bits, followed by the 8-bit byte former 36 connected for the formation of the 8-bit bytes from the hard data bits after their selection. The ultimate SCCC decoding results generated in the substep 119, which contain portions of TRS codewords yet to be decoded, are forwarded in the step 109 of the FIG. 6 method for subsequent decoding of those TRS codewords.

FIG. 8 is an assembly drawing that shows how FIGS. 2, 3, 9 and 5 combine to provide a schematic diagram of alternative receiver apparatus for receiving M/H transmissions sent over the air. The FIG. 8 M/H receiver apparatus is similar to the FIG. 1 M/H receiver apparatus except for the portion of the FIG. 1 M/H receiver apparatus shown in FIG. 4 being replaced by the portion of the FIG. 8 M/H receiver apparatus shown in FIG. 9. In the portion of the FIG. 8 M/H receiver apparatus for decoding TRS codewords that is shown in FIG. 9 the results of turbo decoding are used to locate byte errors for TRS decoding, rather than the results of decoding CRC codewords being used to locate byte errors.

FIG. 9 shows the hard-data-bits selector 35 connected for receiving soft X-sub-2 bits descriptive of M/H-service data, as supplied from the bank 32 of SISO decoders. The hard-data-bits selector 35 is connected for supplying the 8-bit-byte former 36 with hard data bits selected from the bits of the soft X-sub-2 bits. The 8-bit-byte former 36 is operable to form eight-bit bytes responsive to successive hard data bits received from the hard-data-bits selector 35. The output port of the 8-bit-byte former 36 is connected for supplying these 8-bit bytes to a first input port of an extended-byte former 57. The extended-byte former 57 is operable to append to each 8-bit byte a bit or bits supplied to a second input port thereof, which bit or bits regard a respective lack-of-confidence level for that particular 8-bit byte. An output port of the extended-byte former 57 is connected to supply extended bytes, 8-bit portions of which describe bytes of TRS coding, for being written in rows of bytes within RS Frames temporarily stored in the RAM 40. After the writing of each RS Frame concludes, columns of bytes in that RS Frame that is temporarily stored in the RAM 40 define respective TRS codewords. The RAM 40 is operable for successively reading these columns of bytes to the bank 41 of decoders for TRS codewords, which are selectively connected for supplying their decoding results to be written into the byte-organized RAM 42. The RAM 42 is operable for re-interleaving data bytes into normal order for application to a first input port of the bypass unit 43, the second input port of which is connected for receiving 8-bit data bytes directly from the output port of the 8-bit-byte former 36. The output port of the bypass unit 43 is connected for supplying the 8-bit data bytes reproduced therefrom to the input port of the M/H data de-randomizer 44. The output port of the M/H data de-randomizer 44 connects to the input port of the IP-packet parsing unit 45 shown in FIG. 5. The connections and operation of the elements 40-44 in the portion of M/H receiver apparatus shown in FIG. 9 are essentially the same as in the portion of M/H receiver apparatus shown in FIG. 4.

Figure 11:
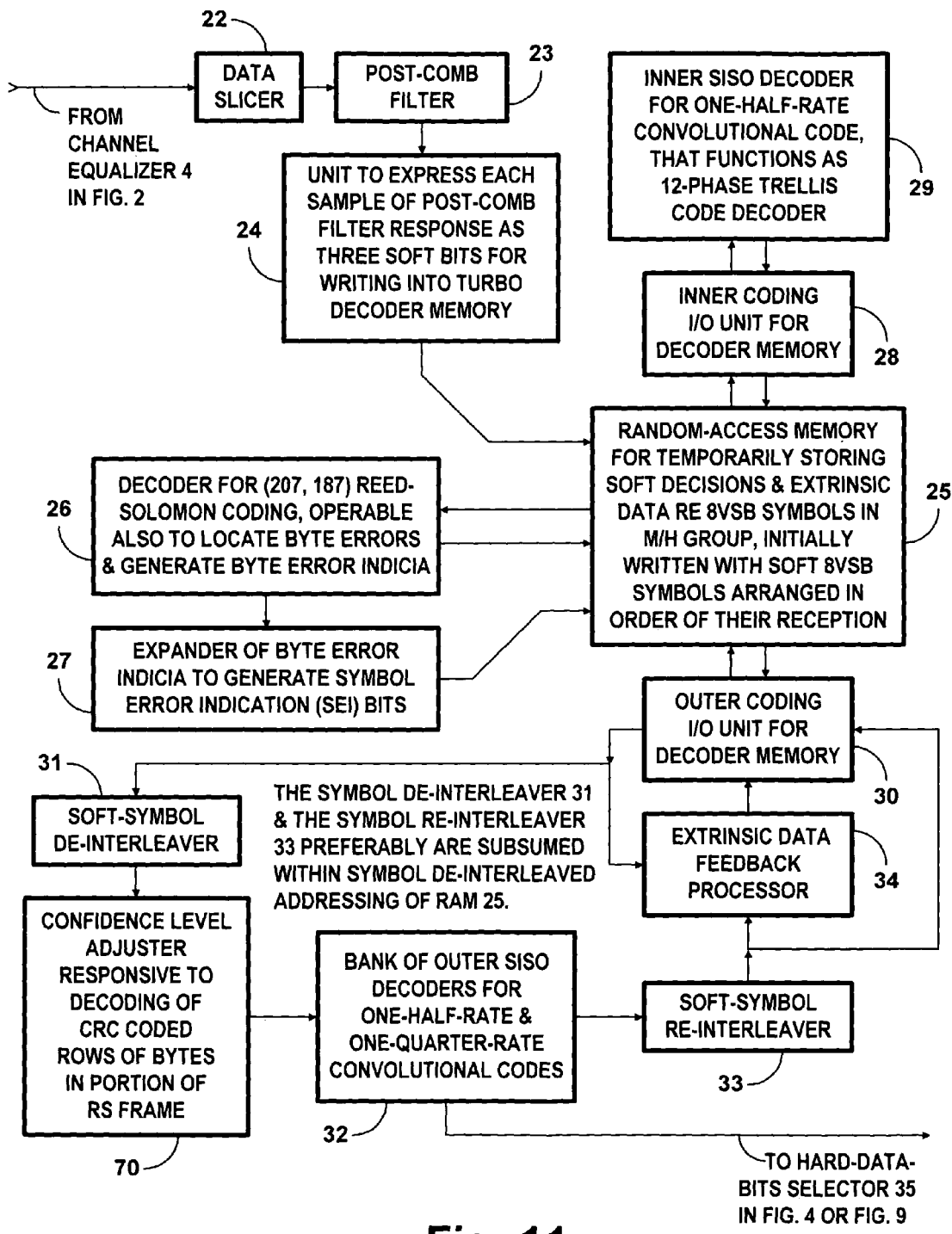
FIG. 11 is a block schematic diagram of a modification of the FIG. 3 turbo decoding apparatus in which the results of decoding CRC codes are used to adjust the confidence levels of soft M/H data bits prior to decoding outer convolutional coding during each cycle of decoding SCCC.
Figure 15:
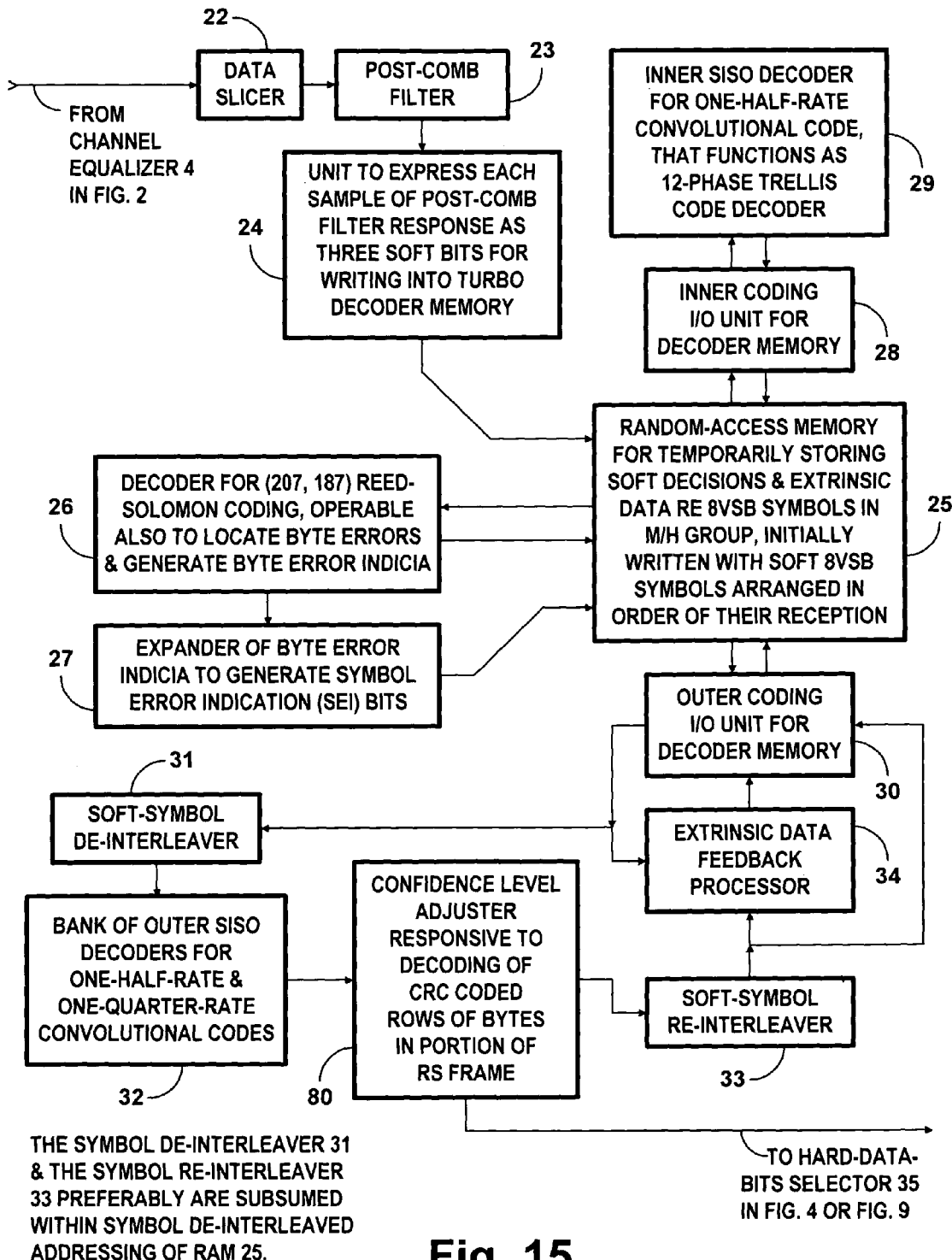
FIG. 15 is a block schematic diagram of a modification of the FIG. 3 turbo decoding apparatus in which the results of decoding CRC codes are used to adjust the confidence levels of soft M/H data bits subsequent to decoding outer convolutional coding during each cycle of SCCC decoding.

FIG. 9 shows a battery 58 of exclusive-OR gates connected to receive soft X-sub-2 data bits supplied from the bank 32 of SISO decoders shown in any one of the FIGS. 3, 11 and 15. These XOR gates exclusive-OR the bits of each soft X-sub-2 data bit with a corresponding hard data bit supplied from the hard-data-bits selector 35. The response from the battery 58 of XOR gates provides successive plural-bit indications each defining a normalized lack-of-confidence level regarding a respective soft X-sub-2 data bit. A selector 59 is operable to reproduce at an output port thereof the largest of the normalized lack-of-confidence levels for each consecutive non-overlapping set of eight soft X-sub-2 data bits, which lack-of-confidence level is to be ascribed to a corresponding 8-bit byte supplied by the 8-bit-byte former 36. The output port of the selector 59 is connected to supply the successive plural-bit lack-of-confidence levels reproduced thereat to the second input port of the extended-byte former 57 to be appended to the corresponding 8-bit byte supplied by the 8-bit-byte former 36.

Figure 10:
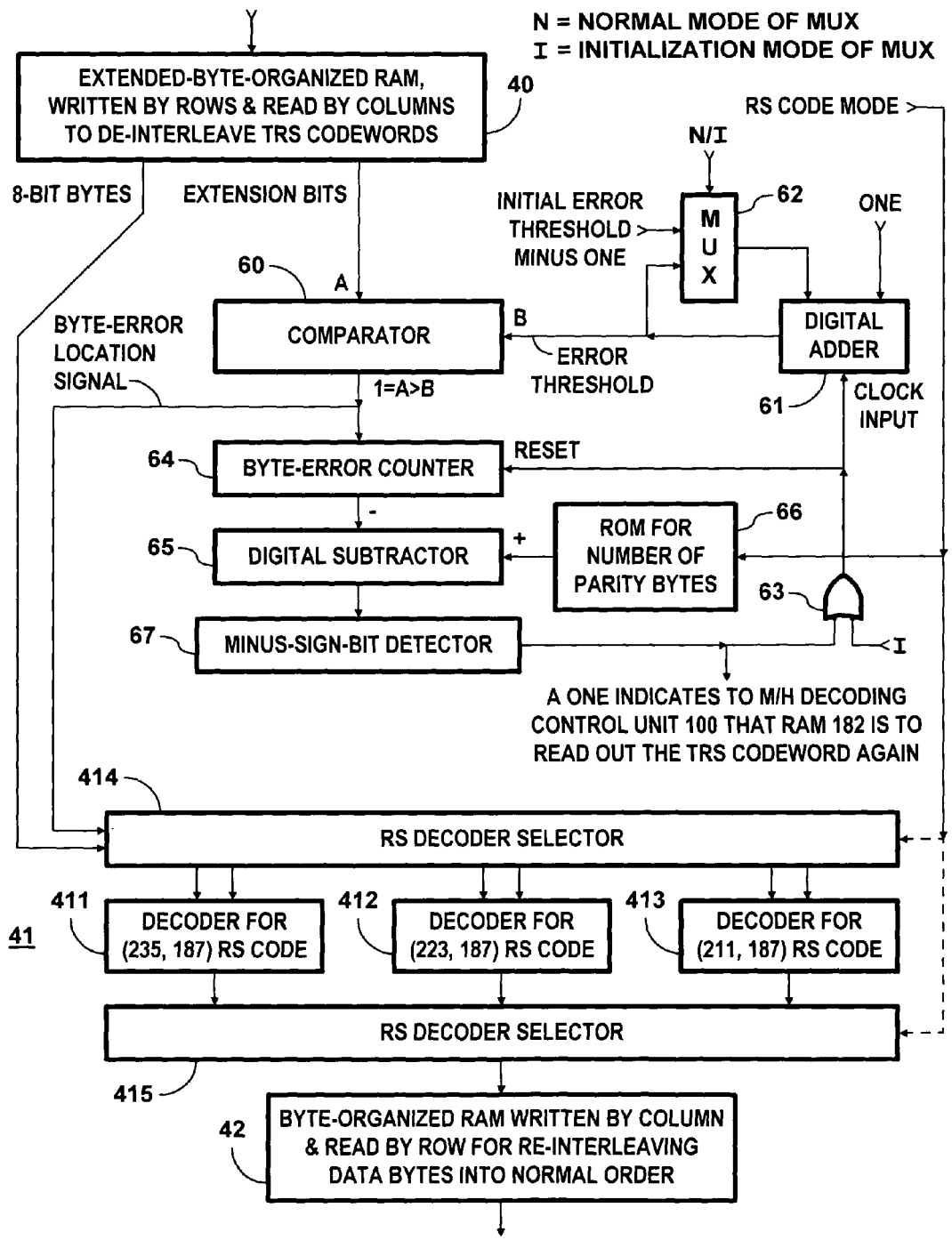
FIG. 10 is a block schematic diagram showing in more detail the circuitry for decoding TRS codewords in the FIG. 9 portion of the alternative M/H receiver apparatus, including a further part of the circuitry for processing turbo decoding results in order to locate byte errors for TRS decoding.

FIG. 10 shows in more detail the bank 41 of RS decoders that the FIG. 9 portion of the FIG. 8 M/H receiver apparatus uses for decoding TRS, including structure to locate byte errors for TRS decoding. The bank 41 of RS decoders is shown as comprising a decoder 411 for (235, 187) RS code, a decoder 412 for (223, 187) RS code, a decoder 413 for (211, 187) RS code, and RS decoder selectors 414 and 415. The RS decoder selector 414 is connected for applying the TRS codeword read from the preceding RAM 40 to one of the decoders 411, 412 and 413 as selected responsive to an RS CODE MODE pair of bits. The RS decoder selector 415 is connected for applying to the succeeding RAM 42 the error-corrected results from the one of the decoders 411, 412 and 413 as selected responsive to the RS CODE MODE pair of bits. The RS CODE MODE pair of bits is generated by the decoding control unit 7 responsive to the RS_code_mode bits in the TPC signals decoded by the decoder 14 for (18, 10) RS FEC code.

The one of decoders 411, 412 and 413 selected for operation initially attempts to correct the TRS codeword using a byte-error-location-and-correction decoding algorithm. If the TRS codeword has too many byte errors to be corrected by this algorithm, the selected decoder then resorts to a byte-error-correction-only decoding algorithm. The RS decoder selector 414 is connected for forwarding indications of byte errors to the selected one of the decoders 411, 412 and 413 together with the bytes of each TRS codeword. The extension bits accompanying each successive 8-bit byte of a TRS codeword from the RAM 40 are supplied to a comparator 60 used as a threshold detector. The extension bits indicate the likelihood that the 8-bit byte is in error, and comparator 60 compares them to an error threshold. If the likelihood that the 8-bit byte is in error exceeds the error threshold, the comparator 60 responds with a logic ONE indicative that the byte is presumably in error. Otherwise, the comparator 60 responds with a logic ZERO indicative that the byte is presumably correct.

FIG. 10 shows the sum output signal from a clocked digital adder 61 supplied to the comparator 60 as the error threshold. The value of the error threshold is initialized in the following way at the outset of each TRS codeword being read from the RAM 40. A two-input multiplexer 62 is connected to supply its response as a first of two summand signals supplied to the adder 61, the second summand signal being arithmetic one. The sum output signal from the clocked adder 61 is applied as one of two input signals to the multiplexer 62, and an initial error threshold value less one is applied as the other input signal to the multiplexer 62. Just before each TRS codeword is read from the RAM 40 a respective pulsed logic ONE is generated by the decoding control unit 7. The pulsed logic ONE is applied as control signal to the multiplexer 62, conditioning it to reproduce the initial error threshold value less one in its response supplied to the adder 61 as a summand input signal. The clocked adder 61 receives its clock signal from an OR gate 63 connected to receive the pulsed logic ONE at one of its input connections. The OR gate 63 reproduces the pulsed logic ONE in its response that clocks an addition by the adder 61. The adder 61 adds its arithmetic one summand input signal to the initial error threshold value less one summand input signal received from the multiplexer 62, generating the initial error threshold value as its sum output signal supplied to the comparator 60.

The pulsed logic ONE also resets to arithmetic zero the output count from a byte-error counter 64 that is connected for counting the number of logic ONEs that the comparator 60 generates during each TRS codeword. This output count is applied as subtrahend input signal to a digital subtractor 65. A read-only memory 66 responds to the RS CODE MODE pair of bits to supply the number of parity bytes in the TRS codewords, which number is supplied as minuend input signal to the subtractor 65. A minus-sign-bit detector 67 is connected for responding to the sign bit of the difference output signal from the subtractor 65. The minus-sign-bit detector 67 generates a logic ONE if and when the number of byte errors in a TRS codeword counted by the counter 64 exceeds the number of parity bytes in a TRS codeword. This logic ONE is supplied to the decoding control unit 7 as an indication that the current TRS codeword is to be read from the RAM 40 again. This logic ONE is supplied to the OR gate 63 as an input signal thereto. The OR gate 63 responds with a logic ONE that resets the counter 64 to zero output count and that clocks the clocked digital adder 61. Normally, the multiplexer 62 reproduces the error threshold supplied as sum output from the adder 61. This reproduced error threshold is applied to the adder 61 as a summand input signal, connecting the clocked adder 61 for clocked accumulation of arithmetic ones in addition to the previous error threshold. The logic ONE from the OR gate 63 causes the error threshold supplied as sum output from the adder 61 to be incremented by arithmetic one, which tends to reduce the number of erroneous bytes located within the TRS codeword upon its being read again from the RAM 65.

If and when the number of erroneous bytes located in the TRS codeword is fewer than the number of parity bytes that the ROM 66 indicates that the TRS codeword should have, the decoding control unit 7 will cause the next TRS codeword in the RS Frame to be processed if such there be. The decoding control unit 7 will begin reading such next TRS codeword from the RAM 40 to the bank 41 of RS decoders and writing the RS decoding results into the RAM 42.

Figure 12:
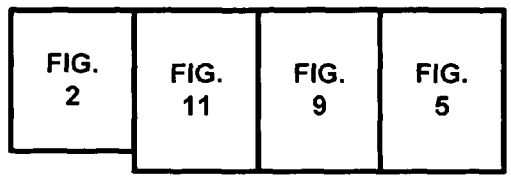
FIG. 12 is an assembly drawing that shows how FIGS. 2, 11, 9 and 5 combine to provide a schematic diagram of another receiver apparatus for receiving M/H transmissions sent over the air.

FIG. 11 shows modified FIG. 3 turbo decoding apparatus in which the results of decoding CRC codes are used to adjust the confidence levels of soft M/H data bits prior to decoding outer convolutional coding during each cycle of turbo decoding SCCC. The turbo decoding apparatus shown in FIG. 11 differs from that shown in FIG. 3 in the following way. A confidence-level adjuster 70 is interposed between the output port of the symbol de-interleaver 31 and the input port of the bank 32 of SISO decoders for outer convolutional coding in SCCC used to transmit M/H data. In the FIG. 11 turbo decoding apparatus, as well as in the FIG. 3 turbo decoding apparatus, the symbol de-interleaver 31 and the symbol re-interleaver 33 need not be actual physical structures, since their functions can be provided for by suitable addressing of the storage locations in the RAM 25. FIG. 12 shows how FIGS. 2, 11, 9 and 5 combine to provide a schematic diagram of another receiver apparatus for receiving M/H transmissions sent over the air.

Figure 13:
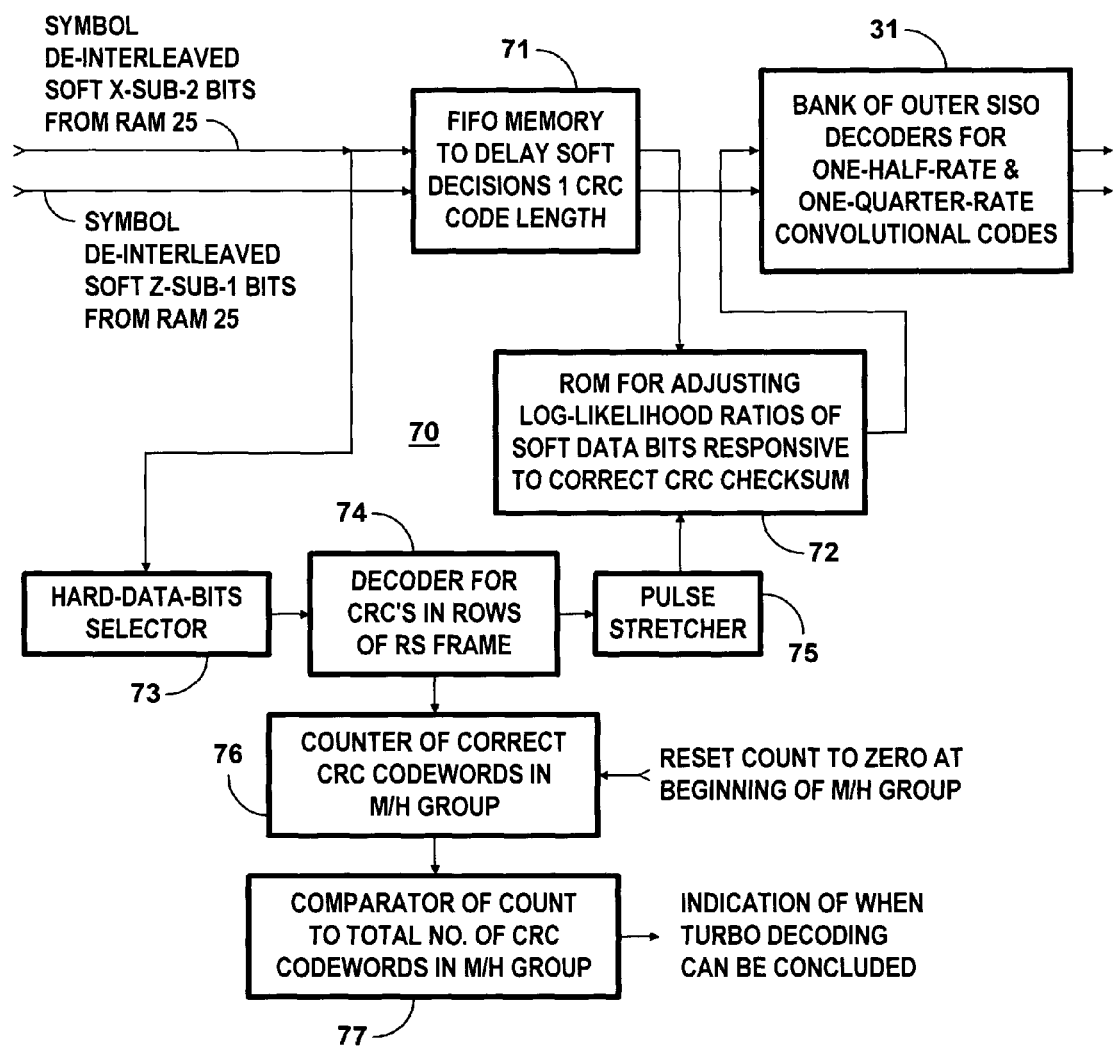
FIG. 13 is a block schematic diagram showing a representative structure of the confidence-level adjuster included in the FIG. 11 modified turbo decoding apparatus.

FIG. 13 shows in detail a representative structure of the confidence-level adjuster 70 used in the FIG. 11 modified turbo decoding apparatus to adjust the confidence levels of soft X-sub-2 data bits supplied to the bank 32 of SISO decoders for outer convolutional coding of the SCCC used to transmit M/H data. The confidence-level adjuster 70 comprises elements 71, 72, 73, 74 and 75. After a delay as long as the time taken for decoding each of the CRC codewords, a first-in/first-out memory 71 reproduces symbol de-interleaved soft X-sub-2 data bits supplied from the RAM 25 and supplies them to a read-only memory 72 as partial input addressing thereto. The ROM 72 is used to adjust the confidence levels of those symbol de-interleaved soft X-sub-2 data bits. The data bits written to the FIFO memory 71 as input addressing are also applied as input signal to a hard-data-bits selector 73. The hard-data-bits selector 73 responds to supply hard data bits as the input signal to the input port of a decoder 74 for the cyclic-redundancy-check coding of CRC codewords contained within each row of bytes in an RS Frame. The decoder 74 includes input circuitry therein for converting the data bits received serially from the hard-data-bits selector 73 to 16-parallel-bit format for the CRC decoding procedures. The decoder 74 is connected for supplying the CRC decoding result to a pulse stretcher 75. The pulse stretcher 75 reproduces the CRC decoding result for the duration of a CRC codeword read from the FIFO memory 71 and is connected for applying that reproduced CRC decoding result to the ROM 72 for completing its input addressing. If the decoder 74 does not detect any error in the CRC codeword, the decoder 74 supplies a ONE to the pulse stretcher 75. The stretched-in-time ONE from the pulse stretcher 75 conditions the ROM 72 to increase the confidence levels of the soft data bits in the CRC codeword as supplied from the ROM 72 to the bank 32 of SISO decoders. If the decoder 74 detects error in the CRC codeword, the decoder 74 supplies a ZERO to the pulse stretcher 75. The stretched-in-time ZERO from the pulse stretcher 75 conditions the ROM 72 to leave unaltered the confidence levels of the soft data bits in the CRC codeword as supplied from the ROM 72 to the bank 32 of SISO decoders.

FIG. 13 further shows a counter 76 connected for counting the number of correct CRC codewords in each M/H Group. The count from the counter 76 is connected for being reset to zero at the beginning of each M/H Group. The counter 76 is connected for supplying its count to a comparator 77 that compares that count to the total number of complete CRC codewords in the M/H Group. That total is susceptible to change, depending on the code-rate of outer convolutional coding, the number of M/H Groups used per RS Frame, and the length of TRS codewords. The comparator 77 is operable for indicating when the count from the counter 76 reaches the total number of complete CRC codewords in the M/H Group. This indication can be used to conclude turbo decoding of the M/H Group when the current cycle of SCCC decoding finishes, rather than continuing the turbo decoding for additional cycles until a specified maximum number of SCCC decoding iterations is reached.

Figure 14:
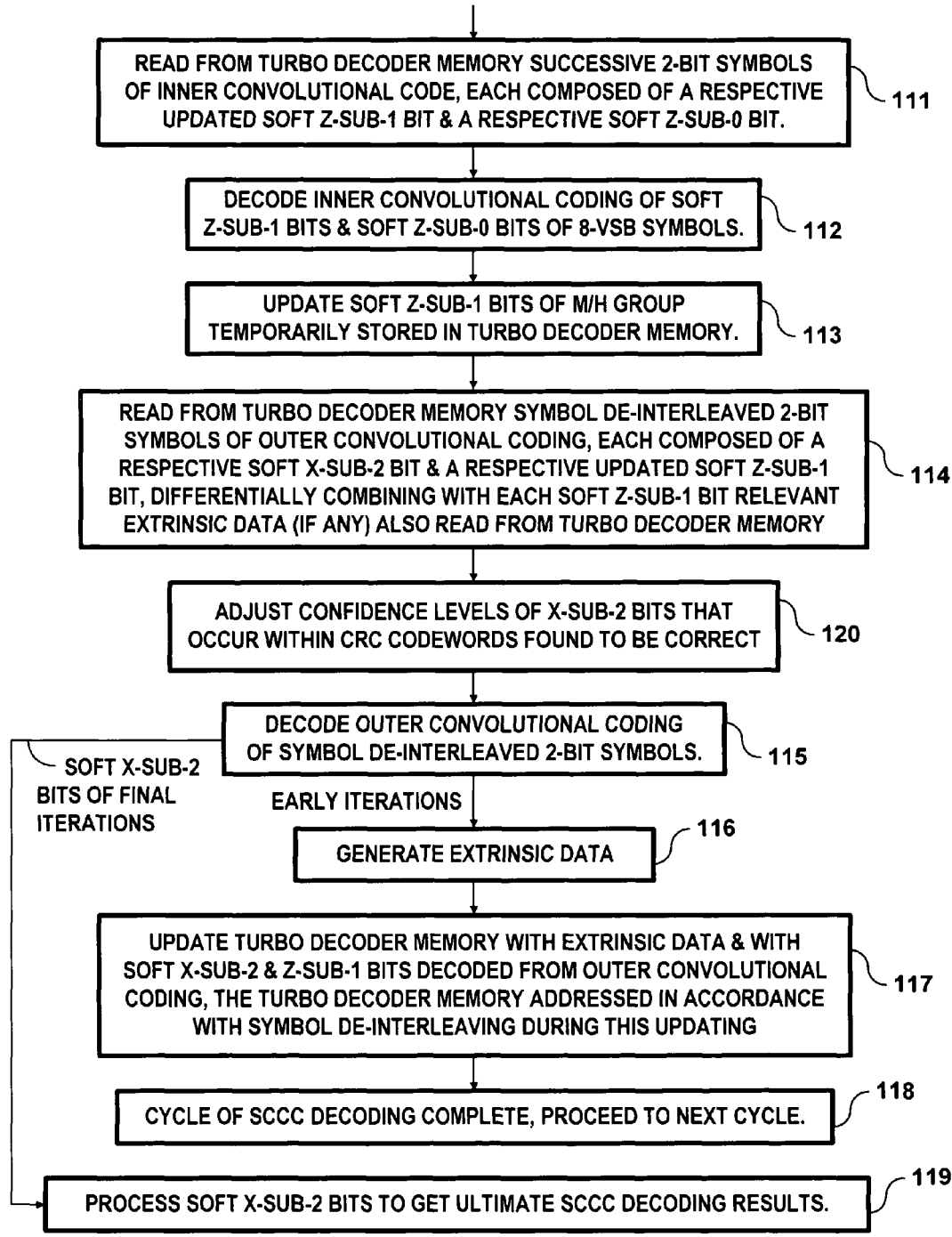
FIG. 14 is an informal flow chart illustrating substeps of a cycle of modified SCCC decoding that is a respective step of the method of turbo decoding illustrated in FIG. 6 when the FIG. 11 turbo decoding apparatus is substituted for the FIG. 3 turbo decoding apparatus.

FIG. 14 is an informal flow chart illustrating substeps of a modified cycle of turbo decoding that is a respective step of the method of turbo decoding illustrated in FIG. 6 when the FIG. 11 turbo decoding apparatus is substituted for the FIG. 3 turbo decoding apparatus. The FIG. 14 flow chart differs from the FIG. 7 flow chart in further including a step 120 of adjusting the confidence levels of data bits occurring within CRC codewords found to be correct. This step 120 directly follows the step 114 of reading symbol de-interleaved updated symbols of outer convolutional coding from the turbo decoder memory in the FIG. 14 flow chart. In the FIG. 14 flow chart this step 120 is then directly followed by the step 115 of decoding the outer convolutional coding.

Figure 16:
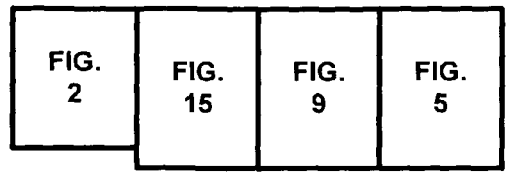
FIG. 16 is an assembly drawing that shows how FIGS. 2, 15, 9 and 5 combine to provide a schematic diagram of still another receiver apparatus for receiving M/H transmissions sent over the air.

FIG. 15 shows a modification of the FIG. 3 turbo decoding apparatus in which the results of decoding CRC codes are used to adjust the confidence levels of soft M/H data bits subsequent to decoding outer convolutional coding during each cycle of turbo decoding SCCC. The turbo decoding apparatus shown in FIG. 15 differs from that shown in FIG. 3 in that a confidence-level adjuster 70 is interposed between the output port of the bank 32 of SISO decoders and the input port of the symbol re-interleaver 33. In the FIG. 15 turbo decoding apparatus, as well as in the FIG. 3 and FIG. 11 turbo decoding apparatuses, the symbol de-interleaver 31 and the symbol re-interleaver 33 need not be actual physical structures. Instead, their functions can be provided for by suitable addressing of the storage locations in the RAM 25. FIG. 16 shows how FIGS. 2, 15, 9 and 5 combine to provide a schematic diagram of still another receiver apparatus for receiving M/H transmissions sent over the air.

Figure 17:
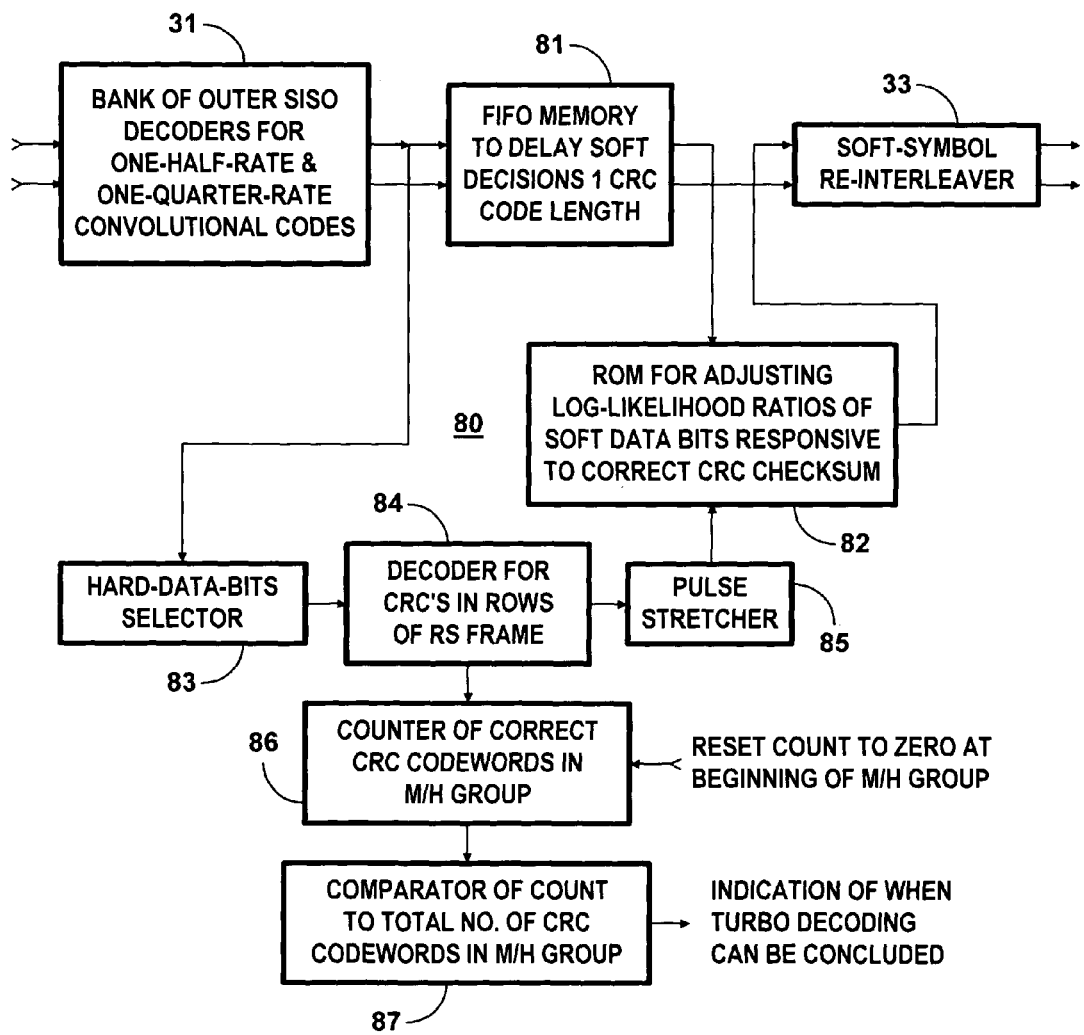
FIG. 17 is a block schematic drawing showing a representative structure of the confidence-level adjuster included in the FIG. 15 modified turbo decoding apparatus.

FIG. 17 shows in detail a representative structure of the confidence-level adjuster 80 used in the FIG. 15 modified turbo decoding apparatus to adjust the confidence levels of symbol de-interleaved soft X-sub-2 data bits supplied from the bank 32 of SISO decoders for outer convolutional coding of the SCCC used to transmit M/H data. The confidence-level adjuster 80 comprises elements 81, 82, 83, 84 and 85. After a delay as long as the time taken for decoding each of the CRC codewords, a first-in/first-out memory 81 reproduces the symbol de-interleaved soft X-sub-2 data bits and soft Z-sub-1 parity bits supplied from the bank 32 of SISO decoders as decoding results. The ROM 82 is used to adjust the confidence levels of those symbol de-interleaved soft X-sub-2 data bits. The data bits written to the FIFO memory 81 as input addressing are also applied as input signal to a hard-data-bits selector 83. The hard-data-bits selector 83 responds to supply hard data bits as the input signal to the input port of a decoder 84 for cyclic-redundancy-check (CRC) codewords contained within each row of bytes in an RS Frame. The decoder 84 includes input circuitry therein for converting the data bits received serially from the hard-data-bits selector 83 to 16-parallel-bit format for the CRC decoding procedures. The decoder 84 is connected for supplying the CRC decoding result to a pulse stretcher 85. The pulse stretcher 85 reproduces the CRC decoding result for the duration of a CRC codeword read from the FIFO memory 81 and is connected for applying that reproduced CRC decoding result to the ROM 82 for completing its input addressing. If the decoder 84 does not detect any error in the CRC codeword, the decoder 84 supplies a ONE to the pulse stretcher 85. The stretched-in-time ONE from the pulse stretcher 85 conditions the ROM 82 to increase the confidence levels of the soft data bits in the CRC codeword as supplied from the ROM 82 to the extrinsic data feedback processor 34. This is done, either via the symbol re-interleaver 33 or directly, depending how the RAM 25 is addressed during updating of extrinsic data temporarily stored therein. If the decoder 84 detects error in the CRC codeword, the decoder 84 supplies a ZERO to the pulse stretcher 85. The stretched-in-time ZERO from the pulse stretcher 85 conditions the ROM 82 to leave unaltered the confidence levels of the soft data bits in the CRC codeword as supplied from the ROM 82 to the extrinsic data feedback processor 34, either via the symbol re-interleaver 33 or directly.

FIG. 17 further shows a counter 86 connected for counting the number of correct CRC codewords in each M/H Group. The count from the counter 86 is connected for being reset to zero at the beginning of each M/H Group. The counter 86 is connected for supplying its count to a comparator 87 that compares that count to the total number of complete CRC codewords in the M/H Group. The comparator is operable for indicating when the count from the counter 86 reaches the total number of complete CRC codewords in the M/H Group. This indication can be used to conclude turbo decoding of the M/H Group when the current cycle of SCCC decoding finishes, rather than continuing the turbo decoding for additional cycles until a specified maximum number of SCCC decoding iterations is reached.

Figure 18:
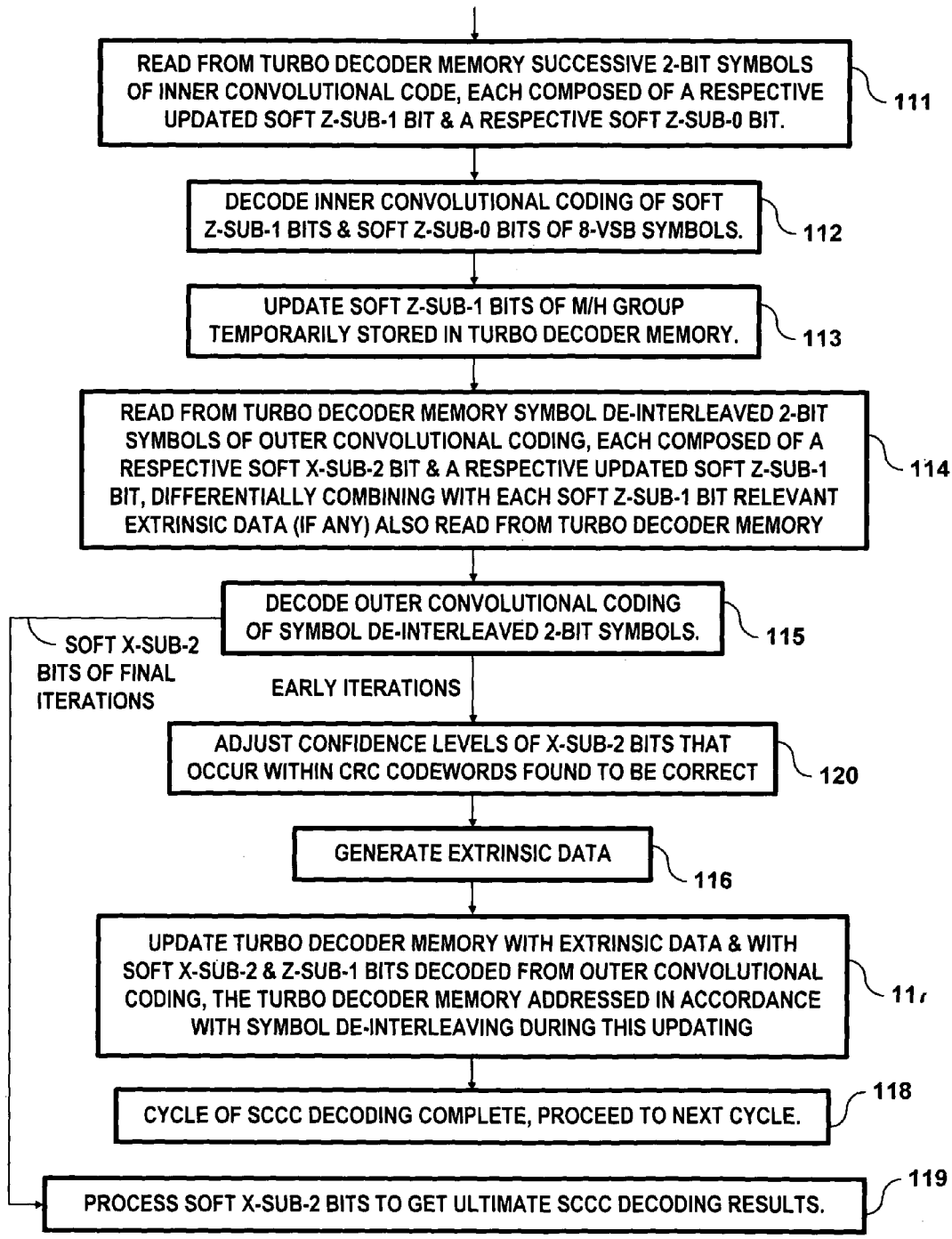
FIG. 18 is an informal flow chart illustrating substeps of a cycle of modified SCCC decoding that is a respective step of the method of turbo decoding illustrated in FIG. 6 when the FIG. 15 turbo decoding apparatus is substituted for the FIG. 3 turbo decoding apparatus.

FIG. 18 is an informal flow chart illustrating substeps of a cycle of modified turbo decoding that is a respective step of the method of turbo decoding illustrated in FIG. 6 when the FIG. 15 turbo decoding apparatus is substituted for the FIG. 3 turbo decoding apparatus. The FIG. 18 flow chart differs from the FIG. 7 flow chart in further including a step 120 of adjusting the confidence levels of data bits occurring within CRC codewords found to be correct. This step 120 directly follows the step 115 of decoding the outer convolutional coding in the FIG. 18 flow chart. In the FIG. 18 flow chart this step 120 is then directly followed by the step 116 of generating extrinsic data.

FIG. 19 depicts a representative arrangement of elements for addressing the random-access memory 25 that FIGS. 3, 11 and 15 include to support turbo decoding. A clocked symbol counter 90 is reset to zero count output before each addressing scan. The clocked symbol counter 90 is connected to supply its count output to three read-only memories 91, 92 and 93 as read addressing for each of them. Each of the ROMs 91, 92 and 93 stores a respective list of addresses for storage locations in the RAM 25. Each of these lists of RAM 25 addresses is read address by successive address with advance of the symbol count applied to the ROMs 91, 92 and 93 as read addressing. An addressing selector 94 is connected for reproducing addresses read from a selected one of the ROMs 91, 92 and 93 for application to the RAM 25. The addressing selector 94 is connected to receive control signal from the decoding control unit 7. This control signal determines which of the sets of addresses supplied from the ROMs 91, 92 and 93 is to be reproduced by the addressing selector 94 for application to the RAM 25.

The ROM 91 stores a first list of addresses for storage locations in the RAM 25. The addresses in this first list are sequentially reproduced by the addressing selector 94 when writing those storage locations initially with successive symbols from each successive one of the 170 data segments in an M/H Group in the order that those symbols are received for such writing. The addresses in the first list stored in ROM 91 are sequentially reproduced by the addressing selector 94 again each time that the 170 data segments of the M/H Group temporarily stored in the RAM 25 are successively read to the inner SISO decoder 29. Also, the addresses in the first list stored in ROM 91 are sequentially reproduced by the addressing selector 94 again each time the RAM 25 is updated with decoding results from the inner SISO decoder 29.

The ROM 92 stores a second list of addresses for selected storage locations in the RAM 25 that temporarily store the 118 non-systematic (207, 187) RS codewords of an M/H Group. The addresses in this second list are sequentially reproduced by the addressing selector 94 when bytes are selectively read from the 170 data segments of the M/H Group temporarily stored in the RAM 25 to the decoder 26 for non-systematic (207, 187) RS codewords and then are returned to their storage locations in the RAM 25 after possible correction by the decoder 26. The addresses for the storage locations that store each non-systematic (207, 187) RS codeword appear twice in this second list, being repeated following their first appearance in the second list. The addresses for the storage locations that store a non-systematic (207, 187) RS codeword appear a first time in the second list when that codeword is being read from the RAM 25 to the decoder 26. Those addresses are repeated to appear a second time in the second list when the codeword is to be written back into the RAM 25 after possible correction by the decoder 26. The clocking of the symbol counter 90 is controlled to permit time for the decoder 26 to decode each non-systematic (207, 187) RS codeword read thereto from the RAM 25 before the codeword is written back into the RAM 25 after possible correction. The addressing of the RAM 25 is such as to de-interleave the convolutional byte interleaving of the 118 non-systematic (207, 187) RS codewords successively read from the RAM 25 to the decoder 26.

The ROM 93 stores a third list of addresses for selected storage locations in the RAM 25 that temporarily store symbols of the SCCC used in transmitting M/H data. The addresses in this third list are sequentially reproduced by the addressing selector 94 each time that 2-bit symbols of symbol de-interleaved outer convolutional coding are read from those selected storage locations in the RAM 25 to the bank 32 of outer SISO decoders. The addresses in this third list are sequentially reproduced by the addressing selector 94 again each time decoding results from the bank 32 of outer SISO decoders are processed for updating soft X-sub-2 bits and extrinsic data temporarily stored in the RAM 25.

Figure 20:
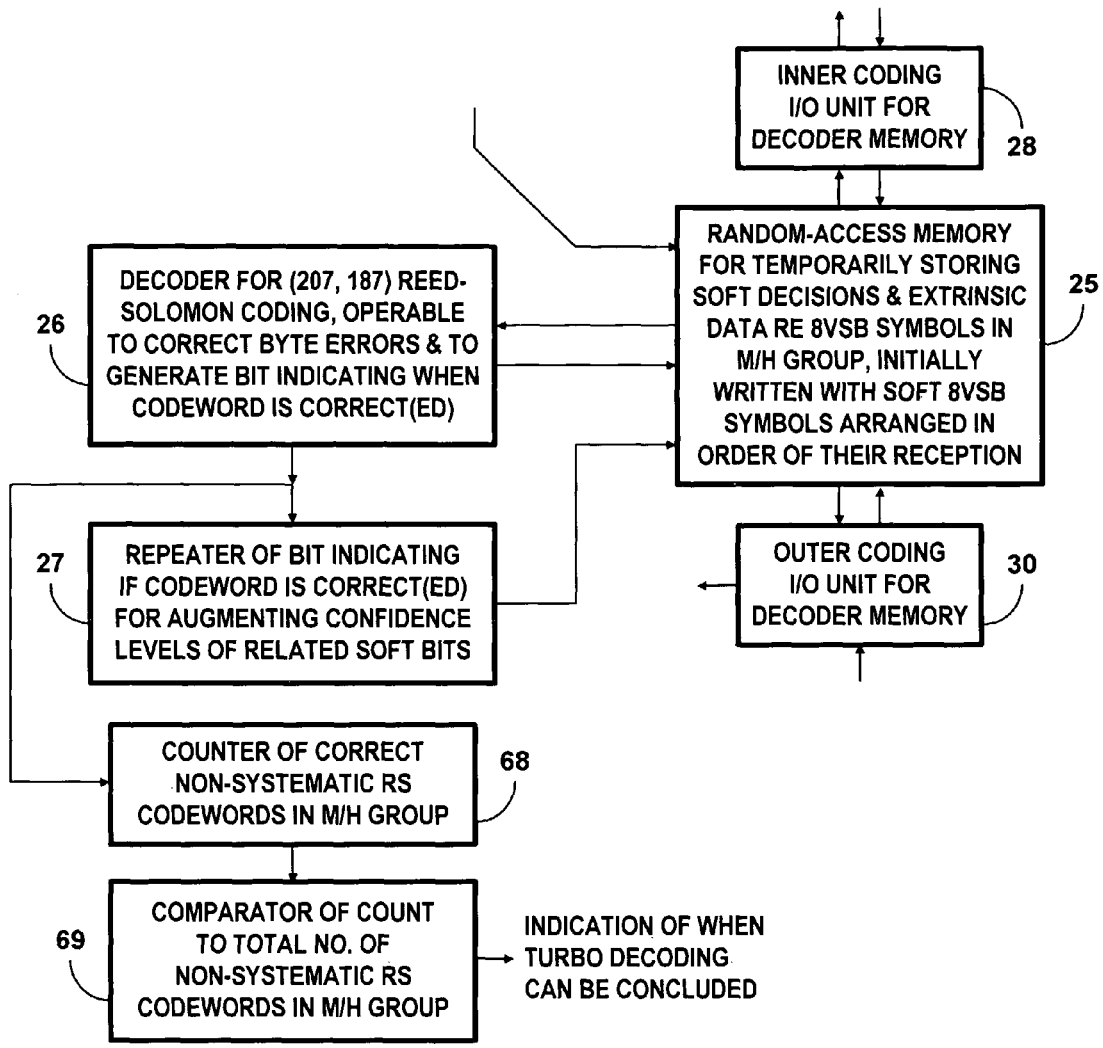
FIG. 20 is a block schematic diagram showing a modification of any of the FIG. 3, FIG. 11 and FIG. 15 portions of M/H receiver apparatus for turbo decoding baseband digital television signal, which modification provides for turbo decoding sometimes to be discontinued before a specified maximum number of iterations is reached.

FIG. 20 shows a modification of any of the FIG. 3, FIG. 11 and FIG. 15 portions of M/H receiver apparatus for turbo decoding baseband digital television signal, which modification provides another mechanism for turbo decoding at times to be discontinued before a specified maximum number of iterations is reached. A counter 68 is connected to count the number of non-systematic (207, 187) RS codewords from a particular M/H group that the decoder 26 for such codewords finds to be correct originally or subsequent to correction. The counter 68 is connected for supplying its count to a comparator 69 that compares that count to 118, the total number of non-systematic (207, 187) RS codewords in the M/H Group. The comparator is operable for indicating when the count from the counter 68 reaches the total number of complete CRC codewords in the M/H Group. This indication can be used to conclude turbo decoding of the M/H Group when the current cycle of SCCC decoding finishes, rather than continuing the turbo decoding for additional cycles until a specified maximum number of decoding iterations is reached. This way of sometimes concluding turbo decoding before a specified maximum number of decoding iterations is reached can replace or augment the way shown in FIG. 13 or the way shown in FIG. 17. The FIG. 20 way of sometimes concluding turbo decoding before a specified maximum number of decoding iterations is reached is advantageous in that it need not take into account incomplete CRC codewords when decoding the SCCC of a particular M/H Group. There are always 118 non-systematic (207, 187) RS codewords in an M/H Group, if it can be completely decoded.

Figure 21:
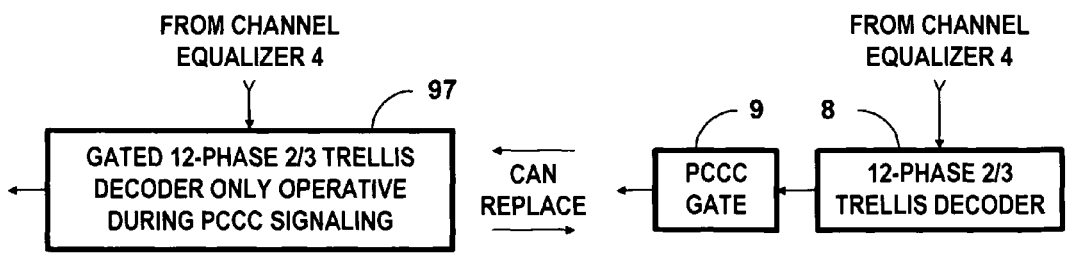
FIG. 21 is a drawing showing that a gated trellis decoder operative only during PCCC signaling can replace the cascade connection of trellis decoder and PCCC gate in the FIG. 2 portion of M/H receiver apparatus.

FIG. 21 shows a gated trellis decoder 97 operative only during PCCC signaling that can replace the cascade connection of the trellis decoder 8 and the PCCC gate 9 in the FIG. 2 portion of M/H receiver apparatus. The gated trellis decoder 97 is powered only during PCCC signaling, so there is less power drain from a battery supplying operating power than there is with a trellis decoder 9 that is powered continuously during 8-VSB signal reception.

Figure 24:
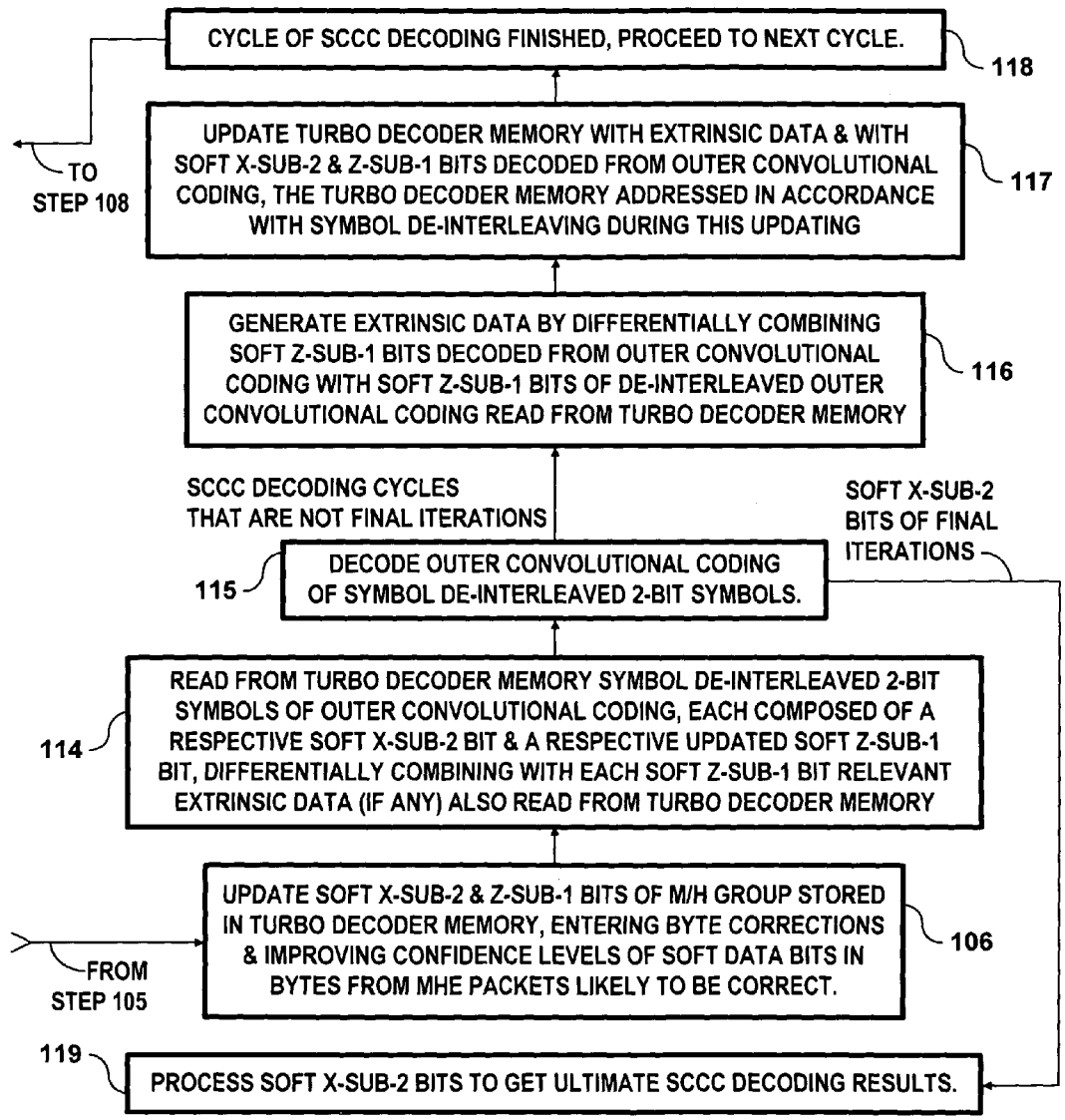
Figure 25:
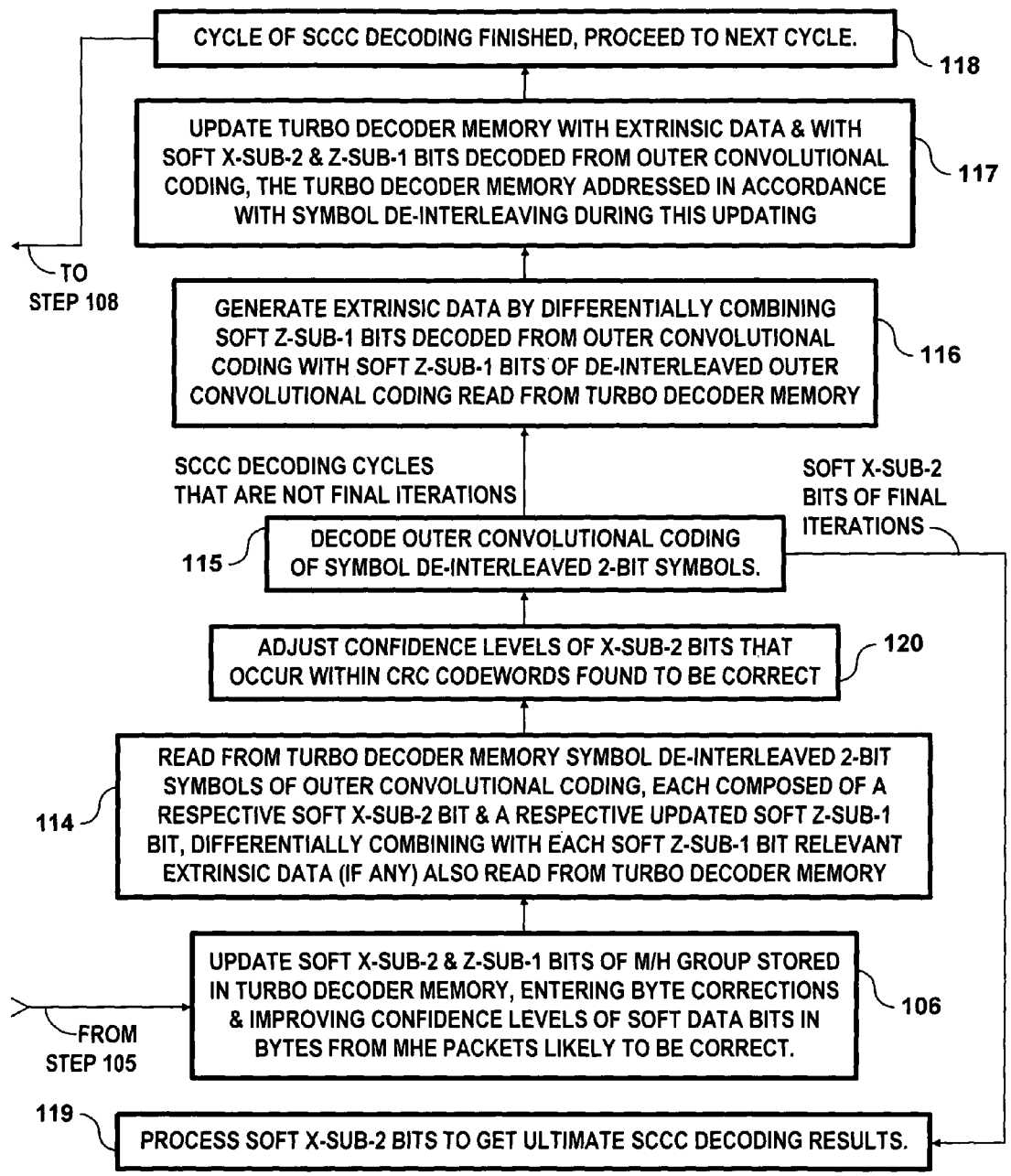
FIG. 25 combines with FIG. 23 to provide an informal flow chart that illustrates the method of turbo decoding employed by the portion of the FIG. 12 M/H receiver apparatus depicted in FIG. 11.
Figure 26:
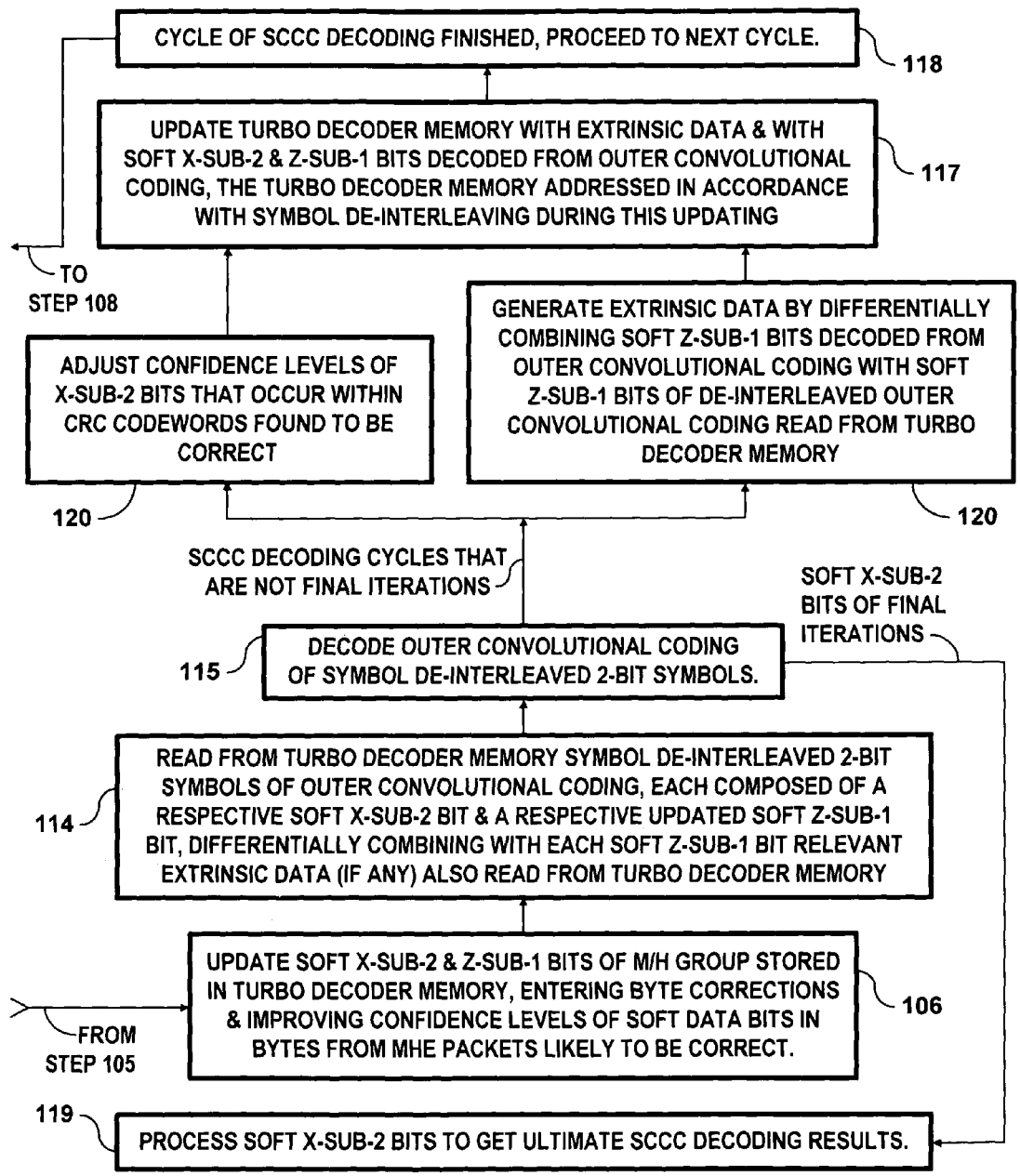
FIG. 26 combines with FIG. 23 to provide an informal flow chart that illustrates the method of turbo decoding employed by the portion of the FIG. 16 M/H receiver apparatus depicted in FIG. 15.

FIGS. 23 and 24 combine to provide an informal flow chart illustrating an alternative method of turbo decoding that the portion of the FIG. 1 M/H receiver apparatus depicted in FIG. 3 can employ instead of the method illustrated in FIGS. 6 and 7. FIGS. 23 and 25 combine to provide an informal flow chart illustrating an alternative method of turbo decoding that the portion of the FIG. 1 M/H receiver apparatus depicted in FIG. 11 can employ instead of the method illustrated in FIGS. 6 and 14. FIGS. 23 and 26 combine to provide an informal flow chart illustrating an alternative method of turbo decoding that the portion of the FIG. 1 M/H receiver apparatus depicted in FIG. 15 can employ instead of the method illustrated in FIGS. 6 and 18. The informal flow chart shown in FIG. 23 and any one of FIGS. 24, 25 and 26 differs from the FIG. 6 informal flow chart in the following ways. The steps 103, 104 and 105 that concern processing the non-systematic (207, 187) RS codewords succeed, rather than precede, decoding of the inner convolutional coding. The steps 103, 104 and 105 that concern processing the non-systematic (207, 187) RS codewords more closely precede decoding of the outer convolutional coding, there being no intervening decoding of the inner convolutional coding.

The method of turbo decoding shown in FIG. 6 and any one of FIGS. 7, 14 and 18 takes considerable time to write all 170 data segments of the M/H Group into the RAM 25 used to support turbo decoding before byte de-interleaved data can be read from the RAM 25 to the decoder 26 for decoding non-systematic (207, 187) RS codewords. RAM 25 has to be loaded with all 170 data segments of the M/H Group before its contents can be scanned for reading byte de-interleaved data therefrom and actual decoding procedures can begin. In the method of turbo decoding shown in FIG. 23 and any one of FIGS. 24, 25 and 265 the inner SISO decoder 29 can commence decoding while the RAM 25 is being written. This is easier to implement if the RAM 25 is plural-ported, being provided with shift registers the stages which can be loaded in parallel to support subsequent shifting of contents to be read out seriatim through serial-output ports auxiliary to the random-access port. Writing the RAM 25 via its random-access port from the unit 24 for expressing each sample of post-comb filter response as three soft bits can then be time-division multiplexed with writing the RAM 25 via its random-access port from the inner SISO decoder 29.

Figure 27:
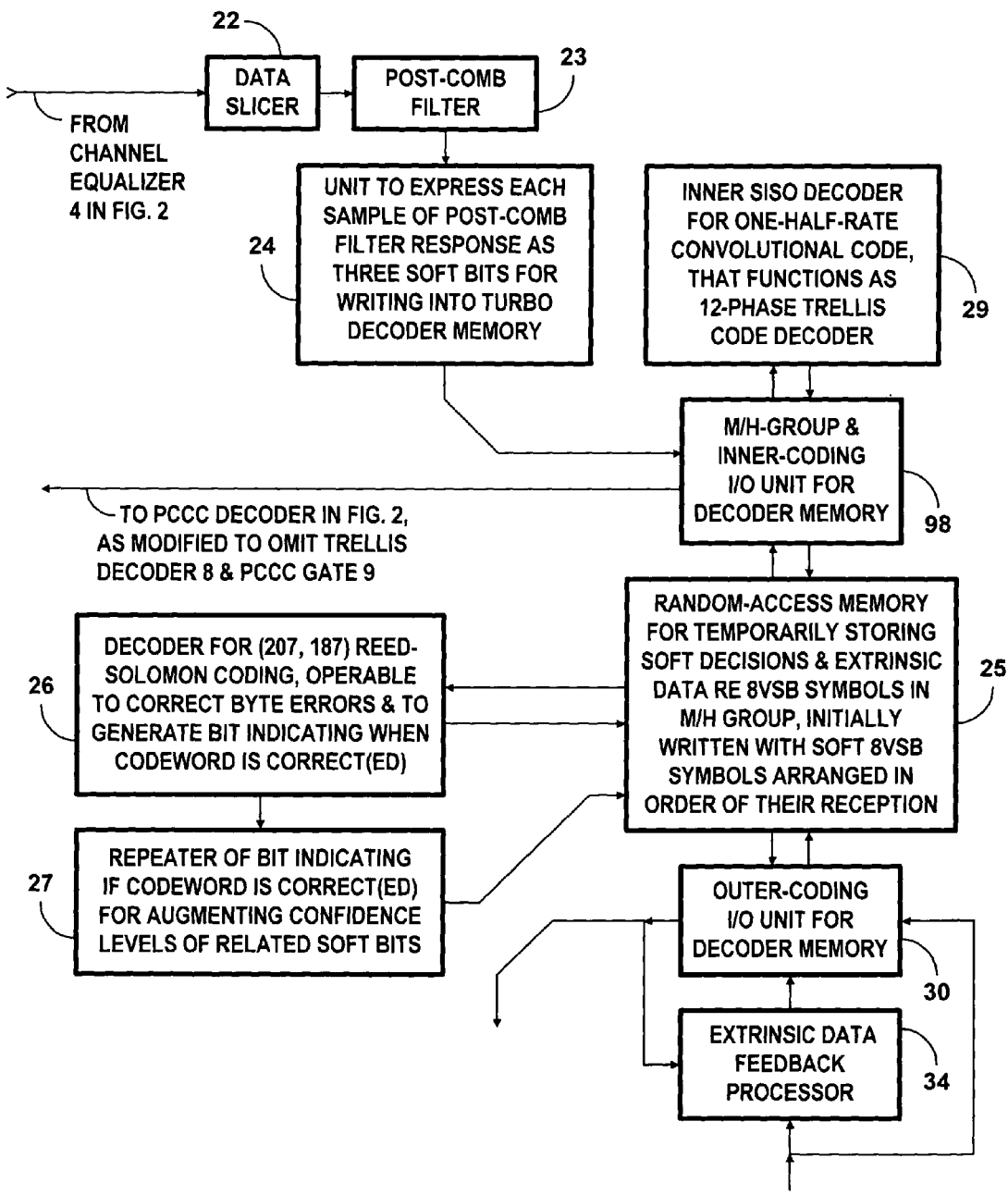
FIG. 27 is a block schematic diagram showing a modification of any of the FIG. 3, FIG. 11 and FIG. 15 portions of M/H receiver apparatus for turbo decoding baseband digital television signal, which modification facilitates the novel alternative methods of turbo decoding illustrated in FIGS. 22 through 26.

FIG. 27 shows a modification of the turbo decoding apparatus shown in FIGS. 3, 11 and 15 that facilitates the methods of turbo decoding illustrated in FIGS. 22-26. In the FIG. 27 modification a more complex input/output unit 98 for the RAM 25 replaces the inner-decoding I/O unit 28. The I/O unit 98 performs additional functions besides routing soft Z-sub-1 bits and soft Z-sub-0 bits from the RAM 25 to the inner SISO decoder 29 and back after SISO decoding, as performed by the inner-decoding I/O unit 28. The I/O unit 98 implements initial loading of M/H Group data into the RAM 25 from the unit 24 for expressing each sample of post-comb filter 23 response as three soft bits. The I/O unit 98 routes the soft Z-sub-1 bits and soft Z-sub-0 bits received from the unit 24 to the inner SISO decoder 29 without appreciable delay. E.g., if the RAM 25 is plural-ported, the soft Z-sub-1 bits and soft Z-sub-0 bits can be selected from the RAM 25 via a serial output port thereof, as noted in the preceding paragraph. Alternatively, of course, the soft Z-sub-1 bits and soft Z-sub-0 bits in the unit 24 response can be supplied directly to the inner SISO decoder 29 at the same time those bits are also being written to the RAM 25. When the unit 24 for expressing each sample of post-comb filter 23 response as three soft bits is loading the M/H Group into the RAM 25, the I/O unit 98 is instrumental in time-division-multiplexed writing of the RAM 25 via its random-access port. The I/O unit 98 time-division-multiplexes the respective responses from the inner SISO decoder 29 and from the unit 24 that are supplied to the random-access port for writing into the RAM 25. The I/O unit 98 also time-division-multiplexes the respective write addressing for writing the RAM 25 with the unit 24 response and for writing the RAM 25 with the inner SISO decoder 29 decoding results.

In order to accommodate operation of the inner SISO decoder 29 while the RAM 25 is still being loaded with post-comb filter 23 response as expressed by the unit 24, RAM 25 addressing requires a more complicated address generation arrangement than shown in FIG. 19. The rate at which the symbol counter 90 is clocked can be doubled. Then, the ROM 91 can be replaced by a ROM that interleaves write addresses to write the RAM 25 with response from the unit 24 (on the one hand) with (on the other hand) write addresses to write the RAM 25 with response from the inner SISO decoder 29. The write addresses to write the RAM 25 with response from the inner SISO decoder 29 will ordinarily delayed respective to the write addresses to write the RAM 25 with response from the response from the unit 24. This is so that the inner SISO decoder 29 is afforded time to decode the inner convolutional coding. So, the write addresses to write the RAM 25 with response from the inner SISO decoder 29 will be a null address. This null address can be detected for withholding write signal from the RAM 25, when otherwise response from the inner SISO decoder 29 would be available at the random-access port for writing to the RAM 25. The write addresses to write the RAM 25 with response from the unit 24 will be a null address after post-comb filter 23 response as expressed by unit 24 for the M/H group has finished loading into the RAM 25, but the inner SISO decoder 29 is still decoding. This null address can be detected for withholding write signal from the RAM 25 when otherwise response from the post-comb filter 23 response as expressed by unit 24 would be available at the random-access port for writing to the RAM 25.

When designing an M/H receiver, a designer is likely to consider whether the inner SISO decoder 29 can be connected to supply PCCC signaling to the PCCC decoder 10, to avoid need for the trellis decoder 8 or the gated trellis decoder 97. FIG. 27 shows the I/O unit 98 connected to route soft Z-sub-1 bits and soft Z-sub-0 bits of selected decoding results from the inner SISO decoder 29 to the PCCC decoder 10, by way of example. Connection of the inner SISO decoder 29 to supply PCCC signaling to the PCCC decoder 10 does present some difficulties in receiver design, however. Typically, the turbo coding apparatus of FIGS. 3, 11, 15 and 15 modified per FIG. 27 does not decode every successive M/H Group. Only every fourth M/H Group may be decoded, for example, which affords the turbo coding apparatus four times as much time for processing. Power consumption by the turbo decoding apparatus is reduced significantly, which is a concern in designing M/H receivers to be battery-powered. In M/H receivers of such design it would be difficult to arrange for the inner SISO decoder 29 to supply PCCC signaling to the PCCC decoder 10 in every M/H Group. A receiver designer might consider settling for the inner SISO decoder 29 to supply PCCC signaling to the PCCC decoder 10 only every fourth M/H Group. However, it is desirable to detect similar PCCC signaling repeatedly, so code combining can be used to suppress any corruption of TPC and FIC signals that is introduced by noise. Using the gated trellis decoder 97 conserves power consumption, while supplying PCCC signaling to the PCCC decoder 10 in every M/H Group. Accordingly, it appears preferable overall to use the gated trellis decoder 97 to supply PCCC signaling to the PCCC decoder 10, rather than trying to reduce hardware by supplying PCCC signaling to the PCCC decoder 10 from the inner SISO decoder 29.

The iterative SCCC decoding procedures using turbo feedback provide advantages in decoding the MHE packets in the non-systematic (207, 187) RS codewords, which advantages are not shared by the parity bytes in those RS codewords. The parity bytes in each of the non-systematic (207, 187) RS codewords are coded like bytes of main-service data, with two-thirds rate trellis coding but without the outer convolutional coding of the SCCC used to transmit M/H-service data. Despite this inherent weakness in the non-systematic (207, 187) RS coding, any help it provides to decoding SCCC comes without the additional cost to payload new forward-error-correction coding would exact. The reduction of payload because of the parity bytes of (207, 187) RS coding is an investment that already has been made in A/153, in order to accommodate some legacy receivers continuing to be able to receive main-service TV.

Moreover, because there are only twenty parity bytes in each non-systematic (207, 187) RS codeword, as opposed to 187 bytes of SCCC, there is a reasonably good chance of the RS codeword being found to be correct or at least correctable, providing that the received 8-VSB signal is not corrupted by noise so severe that SCCC cannot be successfully decoded. The correction of the RS codeword may ultimately reside primarily in correction of its parity bytes themselves, rather than the bytes of SCCC, but at least the correctness of the bytes of SCCC is apt to be confirmed. This is important when trying to conserve M/H receiver power consumption by concluding turbo decoding before a specified maximum number of decoding iterations is reached.

The capability of the decoder 26 for non-systematic (207, 187) RS codewords to correct such a codeword when only a few bytes thereof are in error tends to speeds up turbo decoding. But it can also help avoid long-extended iterations of SCCC coding cycles as burst error rate (BER) is reduced to low values, a phenomenon commonly referred to as "BER floor". While BER floor is less of a problem for SCCC than for PCCC, it is reported still to sometimes become evident in the decoding of SCCC.

A decoder 26 for non-systematic (207, 187) RS codewords that uses a decoding algorithm that locates as well as corrects erroneous bytes is capable of correcting up to ten erroneous bytes in an RS codeword. If the locations of bytes likely to be in error is determined other than by the decoder for non-systematic (207, 187) RS codewords, its capability for correcting erroneous bytes can be doubled. E. g., the locations of bytes likely to be in error can be determined by a decoder for the CRC coding of rows of bytes in an RS Frame. A preferred alternative is to determine the locations of bytes likely to be in error based on the confidence levels of X-sub-2 bits in the non-systematic (207, 187) RS codewords.

The successful decoding of the outer convolutional coding of sequences of SCCC is a reasonably reliable basis for increasing the confidence levels of the soft Z-sub-1 bits in those sequences, as well as increasing the confidence levels of the soft X-sub-2 bits in those sequences. These increased confidence levels of soft Z-sub-1 bits from SCCC will then influence the decoding of the inner convolutional coding including sequences of SCCC bytes isolated by sequences of other types of bytes, including parity bytes of (207, 187) RS codewords. These increased confidence levels of soft Z-sub-1 bits from SCCC influence not only the decoding of the SCCC bytes, but also the decoding of the intervening other types of bytes as well. This is because the decoding of the inner convolutional coding utilizes knowledge concerning the trellis for the one-half-rate inner convolutional coding when determining the most likely sequence of data encoded therein.

It will be apparent to those skilled in the art that various other modifications and variations can be made in the specifically described apparatus without departing from the spirit or scope of the invention. Accordingly, it is intended that these modifications and variations of the specifically described apparatus be considered to result in further embodiments of the invention, provided they come within the scope of the appended claims and their equivalents.

In the appended claims, the word "said" rather than the word "the" is used to indicate the existence of an antecedent basis for a term having being provided earlier in the claims. The word "the" is used for purposes other than to indicate the existence of an antecedent basis for a term having being provided earlier in the claims, the usage of the word "the" for other purposes being consistent with customary grammar in the American English language.

What is claimed:

1. A receiver for serial concatenated convolutional code (SCCC) transmissions imbedded in 8-VSB digital television signals, said receiver comprising:

a tuner for receiving a selected one of 8-VSB digital television signals broadcast at radio frequencies and converting said selected 8-VSB digital television signal to a baseband 8-VSB digital television signal, each successive soft symbol of which is expressed as a respective soft X-sub-2 bit freed from interference-filter pre-coding and a respective soft Z-sub-1 bit and a respective soft Z-sub-0 bit;

a random-access memory (RAM) connected for temporarily storing each successive soft symbol of said baseband 8-VSB digital television signal as so expressed and any soft extrinsic-data bits associated with ones of said soft Z-sub-1 bits associated with outer convolutional coding of concatenated convolutional coding (CCC) within said baseband 8-VSB digital television signal, said RAM further connected for reading de-interleaved bytes of (207, 187) Reed-Solomon (RS) codewords therefrom prior to each cycle of decoding each succession of soft symbols of said SCCC, the bits of said (207, 187) RS codewords being determined by hard decisions concerning soft X-sub-2 and X-sub-1 bits temporarily stored in said RAM;

a first Reed-Solomon (RS) decoder connected for decoding said (207, 187) RS codewords read thereto from said RAM prior to at least some of said cycles of decoding each succession of soft symbols of said SCCC, for updating the temporarily stored contents of said RAM if a (207, 187) RS codeword is corrected by said first RS decoder, and for increasing low confidence factors of soft bits that are associated with the bits in each byte of each one of said (207, 187) RS codewords that said first RS decoder corrects or finds already to be correct;

an inner soft-input/soft-output (SISO) decoder connected for decoding inner convolutional coding of successive soft Z-sub-1 bits and soft Z-sub-0 bits of said baseband 8-VSB digital television signal, as read from said RAM without byte de-interleaving or symbol de-interleaving during an inner-decoding portion of each said cycle of decoding said soft symbols of said SCCC, said inner SISO decoder configured to generate inner-decoding results for updating soft Z-sub-1 bits and soft Z-sub-0 bits of said baseband 8-VSB digital television signal temporarily stored in said RAM;

an outer soft-input/soft-output (SISO) decoder connected for decoding outer convolutional coding of successive soft X-sub-2 bits and adjusted soft Z-sub-1 bits of said SCCC, said RAM configured to read symbol-deinterleaved soft symbols of SCCC therefrom during an outer-decoding portion of each cycle of decoding said soft symbols of said SCCC, each soft symbol of said SCCC composed of a respective soft X-sub-2 bit and a respective Z-sub-1 bit, any extrinsic data regarding said soft Z-sub-1 bits of said SCCC being read from said RAM together with said soft Z-sub-1 bits of said SCCC and being differentially combined with said soft Z-sub-1 bits of said SCCC to generate said adjusted soft Z-sub-1 bits of said SCCC, said outer SISO decoder configured to generate outer-decoding results for updating the soft X-sub-2 bits and Z-sub-1 bits of said SCCC as temporarily stored in said RAM, said outer SISO decoder connected for updating said extrinsic data regarding said soft Z-sub-1 bits of said SCCC as temporarily stored in said RAM;

a hard-data-bits selector connected for selecting respective hard values of soft data bits supplied from said outer SISO decoder during the outer-decoding portion of each concluding cycle of decoding each succession of soft symbols of said SCCC, thereby to generate a bitstream of ultimate SCCC decoding results from decoding each succession of soft symbols of said SCCC;

an 8-bit byte former connected for forming said bitstream of ultimate SCCC decoding results generated by said hard-data-bits selector into a stream of 8-bit bytes of ultimate SCCC decoding results;

a second decoder for Reed-Solomon (RS) codewords connected for decoding transverse Reed-Solomon (TRS) coding of said stream of 8-bit bytes of ultimate SCCC decoding results to reproduce a stream of 8-bit bytes of randomized data;

a data de-randomizer connected for converting said reproduced stream of 8-bit bytes of randomized data to a reproduced stream of 8-bit bytes of de-randomized data;

a parser for extracting internet-protocol (IP) data packets of varying lengths from said reproduced stream of 8-bit bytes of de-randomized data; and apparatus for utilizing said IP data packets extracted by said parser.

2. The receiver set forth in claim 1, wherein said second decoder for RS codewords is configured for decoding a selected one of any of a plurality of prescribed different types of RS codeword.

3. The receiver set forth in claim 1, wherein said first RS decoder is configured for decoding said (207, 187) RS codewords read thereto from said RAM prior to each initial cycle of each series of SCCC decoding cycles.

4. The receiver set forth in claim 1, wherein said first RS decoder is configured for decoding said (207, 187) RS codewords read thereto from said RAM prior to every cycle of SCCC decoding.

5. The receiver set forth in claim 1, further comprising:
a decoder for cyclic-redundancy-check (CRC) codewords reproduced within said stream of 8-bit bytes of SCCC decoding results, said decoder for CRC codewords connected for supplying byte-error-location information to said second decoder for RS codewords.

6. The receiver set forth in claim 1, further comprising:
a battery of exclusive-OR gates for exclusive-ORing each of said soft data bits supplied from said outer SISO decoder with its hard value to generate a soft indication of the lack of confidence that its hard value is correct;

a selector of the largest lack-of-confidence indication for the eight bits in each 8-bit byte of SCCC decoding results to be a lack-of-confidence indication for said each 8-bit byte in toto; and apparatus for locating the 8-bit bytes in each TRS codeword most likely to be in error, based on lack-of-confidence indications supplied from said selector of the largest lack-of-confidence indication for the eight bits in each 8-bit byte of SCCC decoding results, said apparatus for locating the 8-bit bytes in each TRS codeword most likely to be in error connected for supplying byte-error-location information to said second decoder for RS codewords.

7. The receiver set forth in claim 6, wherein said first RS decoder is configured for decoding said (207, 187) RS codewords read thereto from said RAM prior to each initial cycle of each series of cycles of SCCC decoding.

8. The receiver set forth in claim 6, wherein said first RS decoder is configured for decoding said (207, 187) RS codewords read thereto from said RAM prior to every cycle of SCCC decoding.

9. A receiver for serial concatenated convolutional code (SCCC) transmissions imbedded in 8-VSB digital television signals, said receiver comprising:

a tuner for receiving a selected one of 8-VSB digital television signals broadcast at radio frequencies and converting said selected 8-VSB digital television signal to a baseband 8-VSB digital television signal, each successive soft symbol of which is expressed as a respective soft X-sub-2 bit freed from interference-filter pre-coding and a respective soft Z-sub-1 bit and a respective soft Z-sub-0 bit;

a random-access memory (RAM) connected for temporarily storing each successive soft symbol of said baseband 8-VSB digital television signal as so expressed and any soft extrinsic-data bits associated with ones of said soft Z-sub-1 bits associated with outer convolutional coding of concatenated convolutional coding (CCC) within said baseband 8-VSB digital television signal, said RAM further connected for reading de-interleaved bytes of (207, 187) Reed-Solomon (RS) codewords therefrom prior to each cycle of decoding each succession of soft symbols of said SCCC, the bits of said (207, 187) RS codewords being determined by hard decisions concerning soft X-sub-2 and X-sub-1 bits temporarily stored in said RAM;

a first Reed-Solomon (RS) decoder connected for decoding said (207, 187) RS codewords read thereto from said RAM prior to at least some of said cycles of decoding each succession of soft symbols of said SCCC, for updating the temporarily stored contents of said RAM if a (207, 187) RS codeword can be corrected by said first RS decoder, and for increasing low confidence factors of soft bits that are associated with the bits in each byte of each one of said (207, 187) RS codewords that said first RS decoder corrects or finds already to be correct;

an inner soft-input/soft-output (SISO) decoder connected for decoding inner convolutional coding of successive soft Z-sub-1 bits and soft Z-sub-0 bits of said baseband 8-VSB digital television signal, as read from said RAM without byte de-interleaving or symbol de-interleaving during an inner-decoding portion of each said cycle of decoding said soft symbols of said SCCC, said inner SISO decoder configured to generate inner-decoding results for updating soft Z-sub-1 bits and soft Z-sub-0 bits of said baseband 8-VSB digital television signal temporarily stored in said RAM;

a confidence-level adjuster connected for receiving soft X-sub-2 bits of successive soft symbols of outer convolutional coding of said SCCC read with symbol de-interleaving from said RAM during an outer-decoding portion of each cycle of decoding said soft symbols of said SCCC, each said soft symbol of said outer convolutional coding read with symbol de-interleaving from said RAM composed of a respective soft X-sub-2 bit and a respective soft Z-sub-1 bit, any said extrinsic data concerning said respective soft Z-sub-1 bits of said outer convolutional coding being read from said RAM concurrently therewith, said confidence-level adjuster including a decoder for cyclic-redundancy-check (CRC) codewords within soft X-sub-2 bits of said symbol de-interleaved soft symbols of said outer convolutional coding of said SCCC as read from said RAM during said outer-decoding portion of each cycle of decoding said soft symbols of said SCCC, said confidence-level adjuster configured to supply a response in which the confidence levels of soft X-sub-2 bits of particular symbol de-interleaved soft symbols of said outer convolutional coding are increased because they give rise to correct CRC codewords;

an outer soft-input/soft-output (SISO) decoder connected for decoding outer convolutional coding of successive soft X-sub-2 bits and successive soft Z-sub-1 bits of said SCCC, said outer SISO decoder connected for receiving said successive soft X-sub-2 bits of said SCCC as response from said confidence-level adjuster, said outer SISO decoder connected for any extrinsic data in regard to said soft Z-sub-1 bits of said SCCC being read from said RAM together with said soft Z-sub-1 bits of said SCCC and differentially combined with said soft Z-sub-1 bits of said SCCC to adjust said successive soft Z-sub-1 bits of said SCCC before their decoding by said outer SISO decoder, said outer SISO decoder configured to generate decoding results for updating the soft X-sub-2 bits and Z-sub-1 bits of said SCCC as temporarily stored in said RAM, said outer SISO decoder connected for updating said extrinsic data regarding said soft Z-sub-1 bits of said SCCC as temporarily stored in said RAM;

a hard-data-bits selector connected for selecting respective hard values of soft data bits supplied from said outer SISO decoder during each concluding cycle of decoding each succession of soft symbols of said SCCC, thereby to generate a bitstream of ultimate SCCC decoding results from decoding each succession of soft symbols of said SCCC;

an 8-bit byte former connected for forming said bitstream of ultimate SCCC decoding results generated by said hard-data-bits selector into a stream of 8-bit bytes of ultimate SCCC decoding results;

a second decoder for Reed-Solomon (RS) codewords connected for decoding transverse Reed-Solomon (TRS) coding of said stream of 8-bit bytes of ultimate SCCC decoding results to reproduce a stream of 8-bit bytes of randomized data;

a data de-randomizer connected for converting said reproduced stream of 8-bit bytes of randomized data to a reproduced stream of 8-bit bytes of de-randomized data;

a parser for extracting internet-protocol (IP) data packets of varying lengths from said reproduced stream of 8-bit bytes of de-randomized data; and apparatus for utilizing said IP data packets extracted by said parser.

10. The receiver set forth in claim 9, further comprising:

a battery of exclusive-OR gates for exclusive-ORing each of said soft data bits supplied from said outer SISO decoder with its hard value to generate a soft indication of the lack of confidence that its hard value is correct;

a selector of the largest lack-of-confidence indication for the eight bits in each 8-bit byte of SCCC decoding results to be a lack-of-confidence indication for said each 8-bit byte in toto; and apparatus for locating the 8-bit bytes in each TRS codeword most likely to be in error, based on lack-of-confidence indications supplied from said selector of the largest lack-of-confidence indication for the eight bits in each 8-bit byte of said SCCC decoding results, said apparatus for locating the 8-bit bytes in each TRS codeword most likely to be in error connected for supplying byte-error-location information to said second decoder for RS codewords.

11. The receiver set forth in claim 10, wherein said first RS) decoder is configured for decoding said (207, 187) RS codewords read thereto from said RAM prior to each initial cycle of each series of SCCC decoding cycles.

12. The receiver set forth in claim 10, wherein said first RS decoder is configured for decoding said (207, 187) RS codewords read thereto from said RAM prior to every cycle of SCCC decoding.

13. The receiver set forth in claim 9, wherein said first RS) decoder is configured for decoding said (207, 187) RS codewords read thereto from said RAM prior to each initial cycle of each series of SCCC decoding cycles.

14. The receiver set forth in claim 9, wherein said first RS decoder is configured for decoding said (207, 187) RS codewords read thereto from said RAM prior to every cycle of SCCC decoding.

15. A receiver for serial concatenated convolutional code (SCCC) transmissions imbedded in 8-VSB digital television signals, said receiver comprising:

a tuner for receiving a selected one of 8-VSB digital television signals broadcast at radio frequencies and converting it- said selected 8-VSB digital television signal to a baseband 8-VSB digital television signal, each successive soft symbol of which is expressed as a respective soft X-sub-2 bit freed from interference-filter pre-coding and a respective soft Z-sub-1 bit and a respective soft Z-sub-0 bit;

a random-access memory (RAM) connected for temporarily storing each successive soft symbol of said baseband 8-VSB digital television signal as so expressed and any soft extrinsic-data bits associated with ones of said soft Z-sub-1 bits associated with outer convolutional coding of concatenated convolutional coding (CCC) within said baseband 8-VSB digital television signal, said RAM further connected for reading de-interleaved bytes of (207, 187) Reed-Solomon (RS) codewords therefrom prior to each cycle of decoding each succession of soft symbols of said SCCC, the bits of said (207, 187) RS codewords being determined by hard decisions concerning soft X-sub-2 and X-sub-1 bits temporarily stored in said RAM;

a first Reed-Solomon (RS) decoder connected for decoding said (207, 187) RS codewords read thereto from said RAM prior to at least some of said cycles of decoding each succession of soft symbols of said SCCC, for updating the temporarily stored contents of said RAM if a (207, 187) RS codeword is corrected by said first RS decoder, and for increasing low confidence factors of soft bits that are associated with the bits in each byte of each one of said (207, 187) RS codewords that said first RS decoder corrects or finds already to be correct;

an inner soft-input/soft-output (SISO) decoder connected for decoding inner convolutional coding of successive soft Z-sub-1 bits and soft Z-sub-0 bits of said baseband 8-VSB digital television signal, as read from said RAM without byte de-interleaving or symbol de-interleaving during an inner-decoding portion of each said cycle of decoding said soft symbols of said SCCC, said inner SISO decoder configured to generate inner-decoding results for updating soft Z-sub-1 bits and soft Z-sub-0 bits of said baseband 8-VSB digital television signal temporarily stored in said RAM;

an outer soft-input/soft-output (SISO) decoder connected for decoding outer convolutional coding of successive soft X-sub-2 bits and adjusted soft Z-sub-1 bits of said SCCC, said RAM configured to read symbol-deinterleaved soft symbols of SCCC therefrom during an outer-decoding portion of each cycle of decoding said soft symbols of said SCCC, each soft symbol of said SCCC composed of a respective soft X-sub-2 bit and a respective Z-sub-1 bit, any extrinsic data regarding said soft Z-sub-1 bits of said SCCC being read from said RAM together with said soft Z-sub-1 bits of said SCCC and being differentially combined with said soft Z-sub-1 bits of said SCCC to generate said adjusted soft Z-sub-1 bits of said SCCC, said outer SISO decoder configured to generate soft X-sub-2 bits and soft Z-sub-1 bits of outer-decoding results regarding said SCCC, said outer SISO decoder connected such that said soft Z-sub-1 bits of said outer-decoding results update said soft Z-sub-1 bits of said SCCC as temporarily stored in said RAM together with said extrinsic data in regard to said soft Z-sub-1 bits of said SCCC as also temporarily stored in said RAM;

a confidence-level adjuster connected for receiving from said outer SISO decoder said soft X-sub-2 bits of said outer-decoding results regarding said SCCC, said confidence-level adjuster including a decoder for cyclic-redundancy-check (CRC) codewords within said soft X-sub-2 bits of said of said outer-decoding results received by said confidence-level adjuster, said confidence-level adjuster configured to supply a response in which the confidence levels of particular successive soft symbols received by said confidence-level adjuster are increased because they give rise to correct CRC codewords, said confidence-level adjuster connected for writing adjusted soft X-sub-2 bits therefrom to said RAM for updating the soft symbols of said SCCC temporarily stored therein;

a hard-data-bits selector connected for selecting respective hard values of soft data bits supplied from said outer SISO decoder during each concluding cycle of decoding each succession of soft symbols of said SCCC, thereby to generate a bitstream of ultimate SCCC decoding results from decoding each succession of soft symbols of said SCCC;

an 8-bit byte former connected for forming said bitstream of ultimate SCCC decoding results generated by said hard-data-bits selector into a stream of 8-bit bytes of ultimate SCCC decoding results;

a second decoder for Reed-Solomon (RS) codewords connected for decoding transverse Reed-Solomon (TRS) coding of said stream of 8-bit bytes of ultimate SCCC decoding results to reproduce a stream of 8-bit bytes of randomized data;

a data de-randomizer connected for converting said reproduced stream of 8-bit bytes of randomized data to a reproduced stream of 8-bit bytes of de-randomized data;

a parser for extracting internet-protocol (IP) data packets of varying lengths from said reproduced stream of 8-bit bytes of de-randomized data; and apparatus for utilizing said IP data packets extracted by said parser.

16. The receiver set forth in claim 15, further comprising:

a battery of exclusive-OR gates for exclusive-ORing each of said soft data bits supplied from said outer SISO decoder with its hard value to generate a soft indication of the lack of confidence that its hard value is correct;

a selector of the largest lack-of-confidence indication for the eight bits in each 8-bit byte of turbo decoding results to be a lack-of-confidence indication for said each 8-bit byte in toto; and apparatus for locating the 8-bit bytes in each TRS codeword most likely to be in error, based on lack-of-confidence indications supplied from said selector of the largest lack-of-confidence indication for the eight bits in each 8-bit byte of turbo decoding results, said apparatus for locating the 8-bit bytes in each TRS codeword most likely to be in error connected for supplying byte-error-location information to said second decoder for RS codewords.

17. A receiver as The receiver set forth in claim 16, wherein said first RS) decoder is configured for decoding said (207, 187) RS codewords read thereto from said RAM prior to each initial cycle of each series of SCCC decoding cycles.

18. The receiver set forth in claim 16, wherein said first RS decoder is configured for decoding said (207, 187) RS codewords read thereto from said RAM prior to every cycle of SCCC decoding.

19. The receiver set forth in claim 15, wherein said first RS) decoder is configured for decoding said (207, 187) RS codewords read thereto from said RAM prior to each initial cycle of each series of SCCC decoding cycles.

20. The receiver set forth in claim 15, wherein said first RS decoder is configured for decoding said (207, 187) RS codewords read thereto from said RAM prior to every cycle of SCCC decoding.

* * * * *